(12) United States Patent
Zhu

(10) Patent No.: US 11,810,823 B2
(45) Date of Patent: Nov. 7, 2023

(54) SEMICONDUCTOR ARRANGEMENTS AND METHODS FOR MANUFACTURING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 564 days.

(21) Appl. No.: 17/037,364

(22) Filed: Sep. 29, 2020

(65) Prior Publication Data

US 2021/0013105 A1    Jan. 14, 2021

Related U.S. Application Data

(60) Division of application No. 16/222,570, filed on Dec. 17, 2018, now Pat. No. 10,825,738, which is a
(Continued)

(30) Foreign Application Priority Data

Nov. 28, 2013   (CN) .......................... 201310627406.8

(51) Int. Cl.
   *H01L 21/8234* (2006.01)
   *H01L 27/088* (2006.01)
   (Continued)

(52) U.S. Cl.
   CPC ............... *H01L 21/823481* (2013.01); *H01L 21/26533* (2013.01); *H01L 21/3081* (2013.01); *H01L 21/762* (2013.01); *H01L 21/76224* (2013.01); *H01L 21/76232* (2013.01); *H01L 21/823431* (2013.01); *H01L 27/0886* (2013.01); *H01L 29/0649* (2013.01); *H01L 29/6653* (2013.01);
   (Continued)

(58) Field of Classification Search
   None
   See application file for complete search history.

(56) References Cited

U.S. PATENT DOCUMENTS 8,609,510 B1 * 12/2013 Banna ............. H01L 21/823431
257/E21.409

* cited by examiner

*Primary Examiner* — Joseph C. Nicely
*Assistant Examiner* — Lamont B Koo
(74) *Attorney, Agent, or Firm* — Christensen, Fonder, Dardi & Herbert PLLC

(57) ABSTRACT

Semiconductor arrangements and methods of manufacturing the same. The semiconductor arrangement may include: a substrate including a base substrate, a first semiconductor layer on the substrate, and a second semiconductor layer on the first semiconductor layer; first and second fin structures formed on the substrate and extending in the same straight line, each of the first and second fin structures including at least portions of the second semiconductor layer; a first isolation part formed around the first and second fin structures on opposite sides of the straight line; first and second FinFETs formed on the substrate based on the first and second fin structures respectively; and a second isolation part between the first and second fin structures and intersecting the first and second fin structures to isolate the first and second fin structures from each other.

12 Claims, 21 Drawing Sheets

Related U.S. Application Data continuation-in-part of application No. 15/723,928, filed on Oct. 3, 2017, now Pat. No. 10,861,748, which is a continuation-in-part of application No. 14/411,073, filed as application No. PCT/CN2014/070713 on Jan. 16, 2014, now Pat. No. 9,780,200.

(51) Int. Cl.
| | | |
|---|---|---|
| *H01L 21/308* | (2006.01) | |
| *H01L 21/762* | (2006.01) | |
| *H01L 29/66* | (2006.01) | |
| *H01L 29/78* | (2006.01) | |
| *H01L 29/06* | (2006.01) | |
| *H01L 21/265* | (2006.01) | |

(52) U.S. Cl.
CPC .... *H01L 29/6656* (2013.01); *H01L 29/66545* (2013.01); *H01L 29/66795* (2013.01); *H01L 29/785* (2013.01); *H01L 21/26513* (2013.01); *H01L 21/26586* (2013.01); *H01L 21/823412* (2013.01); *H01L 29/7848* (2013.01)

SEMICONDUCTOR ARRANGEMENTS AND METHODS FOR MANUFACTURING THE SAME

CROSS-REFERENCE TO RELATED APPLICATIONS

This application is a divisional application of U.S. patent application Ser. No. 16/222,570, filed Dec. 17, 2018, which is a continuation-in-part application of U.S. patent application Ser. No. 15/723,928, filed Oct. 3, 2017, which is a continuation-in-part of U.S. patent application Ser. No. 14/411,073, filed Dec. 23, 2014, now U.S. Pat. No. 9,780,200, issued Oct. 3, 2017, which is a national stage entry of PCT/CN2014/070713, filed Jan. 16, 2014, which claims priority to Chinese Patent Application No. 201310627406.8, filed Nov. 28, 2013, all of which are incorporated by reference in their entirety herein.

TECHNICAL FIELD

The present disclosure generally relates to manufacture of integrated circuits, and in particular, to a semiconductor arrangement comprising an isolation part with a reduced area penalty and a method of manufacturing the same.

BACKGROUND

With increasing demands for multi-functional miniaturized electronic devices, it is expected to integrate more and more devices on a wafer. However, current devices have already been so miniaturized to approach physical limits, and thus it is more and more difficult to further reduce an average area per device. Further, any area penalty may result in increased cost.

One of solutions to follow the trend of miniature is 3D devices, such as, FinFETs (Fin Field Effect Transistors). The FinFETs have reduced footprints on a wafer surface by extending in a height direction. However, as compared with planar devices such as MOSFETs, more areas are occupied by isolation between FinFETs because each isolation requires two dummy gates. In addition, the overlay in patterning or lithography during the formation of the isolations may also have footprints and thus increase the manufacturing cost.

SUMMARY

In view of the above, the present disclosure proposes semiconductor arrangements and methods of manufacturing the same to address at least the above problems and/or at least provide the following advantages.

According to an aspect of the present disclosure, a semiconductor arrangement is provided. The semiconductor arrangement comprises: a substrate comprising a base substrate, a first semiconductor layer disposed on the base substrate, and a second semiconductor layer disposed on the first semiconductor layer; a first fin structure and a second fin structure formed on the substrate and extending in the same straight line, each of the first fin structure and the second fin structure comprising at least portions of the second semiconductor layer; a first isolation part formed around the first fin structure and the second fin structure on opposite sides of the straight line; a first Fin Field Effect Transistor (FinFET) formed on the substrate based on the first fin structure and a second FinFET formed on the substrate based on the second fin structure, wherein the first FinFET comprises a first gate stack formed on the first isolation part and intersecting the first fin structure, and the second FinFET comprises a second gate stack formed on the first isolation part and intersecting the second fin structure; and a second isolation part between the first fin structure and the second fin structure and intersecting the first fin structure and the second fin structure to isolate the first fin structure and the second fin structure from each other, wherein the second isolation part extends in parallel with at least one of the first gate stack and the second gate stack.

According to an embodiment, the first isolation part may have a top surface below a top surface of the second semiconductor layer or below a bottom surface of the second semiconductor layer.

According to an embodiment, in a vertical section taken along the straight line, the second isolation part may comprise an upper portion and a lower portion which is expanded with respect to a bottom end of the upper portion.

According to an embodiment, in the vertical section, the upper portion of the second isolation part may have a top end expanded with respect to the bottom end thereof.

According to an embodiment, the lower portion of the second isolation part may form a step with respect to the bottom end of the upper portion, wherein the step is coplanar with a bottom surface of the second semiconductor layer.

According to an embodiment, the second isolation part may penetrate the second semiconductor layer downwards, wherein a portion of the second isolation part directly under the first fin structure has a top surface abutting a bottom surface of the second semiconductor layer, and a portion of the second isolation part directly under the second fin structure has a top surface abutting the bottom surface of the second semiconductor layer.

According to an embodiment, in a direction in which the straight line extends, a portion of the second isolation part directly under the first fin structure may extend to a position of a source/drain region of the first FinFET, and a portion of the second isolation part directly under the second fin structure may extend to a position of a source/drain region of the second FinFET.

According to an embodiment, the semiconductor arrangement may further comprise a third isolation part extending along the first fin structure under the portion of the second semiconductor layer in the first fin structure and/or a fourth isolation part extending along the second fin structure under the portion of the second semiconductor layer in the second fin structure.

According to an embodiment, in the vertical section taken along the straight line, the third isolation part may be centrically aligned with the first gate stack in a vertical direction, and/or the fourth isolation part may be centrically aligned with the second gate stack in the vertical direction.

According to an embodiment, a top surface of the third isolation part may abut a bottom surface of the portion of the second semiconductor layer in the first fin structure, and/or a top surface of the fourth isolation part may abut a bottom surface of the portion of the second semiconductor layer in the second fin structure.

According to an embodiment, the third isolation part and the fourth isolation part may have respective top surfaces coplanar with the step.

According to an embodiment, in a direction in which the straight line extends, the third isolation part may extend to positions of source/drain regions of the first FinFET, and/or the fourth isolation part may extend to positions of source/drain regions of the second FinFET.

According to an embodiment, the semiconductor arrangement may further comprise a further semiconductor layer which is at least partially embedded into a corresponding one of the fin structures on respective opposite sides of the first gate stack and/or the second gate stack, wherein the first FinFET and/or the second FinFET comprise respective source/drain regions at least partially formed in the further semiconductor layer, wherein the further semiconductor layer of at least one of the first FinFET and the second FinFET has a stack structure.

According to an embodiment, in the vertical section taken along the straight line, the lower portion and the upper portion of the second isolation part may be centrically aligned in a vertical direction.

According to an embodiment, the semiconductor arrangement may further comprise: a first spacer on sidewalls of the first gate stack; a second spacer on sidewalls of the second gate stack; and a dummy spacer between the first spacer and the second spacer, wherein the second isolation part is self-aligned to a space defined by the dummy spacer.

According to an embodiment, the semiconductor arrangement may further comprise an insulating thin layer formed at least on sidewalls of the upper portion of the second isolation part.

According to an embodiment, the semiconductor arrangement may further comprise an insulating thin layer formed at least on a part of sidewalls of the second isolation part.

According to another aspect of the present disclosure, there is provided a semiconductor arrangement. The semiconductor arrangement comprises: a substrate; a first fin structure and a second fin structure formed on the substrate and extending in the same straight line; a first isolation part formed on the substrate and around the first fin structure and the second fin structure on opposite sides of the straight line; a first Fin Field Effect Transistor (FinFET) formed on the substrate based on the first fin structure and a second FinFET formed on the substrate based on the second fin structure, wherein the first FinFET comprises a first gate stack formed on the first isolation part and intersecting the first fin structure, and the second FinFET comprises a second gate stack formed on the first isolation part and intersecting the second fin structure; and a second isolation part between the first fin structure and the second fin structure and intersecting the first fin structure and the second fin structure to isolate the first fin structure and the second fin structure from each other, wherein the second isolation part extends in parallel with at least one of the first gate stack and the second gate stack, and the second isolation part has a lower portion expanded with respect to an upper portion thereof, wherein in a vertical section taken along the straight line, the lower portion and the upper portion of the second isolation part are centrically aligned in a vertical direction.

According to an embodiment, the lower portion of the second isolation part may have a hollow structure.

According to an embodiment, the second isolation part may have an insulating thin layer at least on sidewalls of the upper portion thereof.

According to an embodiment, the semiconductor arrangement may further comprise: a first spacer on sidewalls of the first gate stack; a second spacer on sidewalls of the second gate stack; and a dummy spacer between the first spacer and the second spacer, wherein the second isolation part is self-aligned to a space defined by the dummy spacer.

According to an embodiment, the lower portion of the second isolation part may be substantially centrically aligned with respect to the space defined by the dummy spacer.

According to an embodiment, in a top view, the lower portion of the second isolation part may be symmetrical with respect to a longitudinally extending line of the space defined by the dummy spacer.

According to an embodiment, the first gate stack and the second gate stack may be recessed with respect to the first gate spacer and the second gate spacer respectively, and the semiconductor arrangement may further comprise dielectric layers disposed on top of the first gate stack and the second gate stack inside the first gate spacer and the second gate spacer, respectively.

According to an embodiment, the semiconductor arrangement may further comprise a further semiconductor layer which is at least partially embedded into a corresponding one of the fin structures on respective opposite sides of the first gate stack and/or the second gate stack, wherein the first FinFET and/or the second FinFET comprise respective source/drain regions at least partially formed in the further semiconductor layer.

According to a further aspect of the present disclosure, a method of manufacturing a semiconductor arrangement is provided. The method comprises: providing a stack structure in which a base substrate, a first semiconductor layer, and a second semiconductor layer are stacked in sequence; forming a fin structure on the stack structure, wherein the fin structure has a bottom portion lower than a bottom surface of the second semiconductor layer; forming a first isolation part around the fin structure on opposite sides of the fin structure; forming, on the first isolation part, a dummy gate structure intersecting the fin structure, and forming, on opposite sides of the dummy gate structure, a first gate structure and a second gate structure intersecting the fin structure respectively; forming a first gate spacer, a second gate spacer, and a dummy spacer on sidewalls of the first gate structure, the second gate structure, and the dummy gate structure, respectively; removing the dummy gate structure to expose the first semiconductor layer inside the dummy spacer; selectively etching the first semiconductor layer; forming a portion of the second isolation part by filling a dielectric material into a space due to the selective etching of the first semiconductor layer under the second semiconductor layer inside the dummy spacer; selectively etching the fin structure based on the dummy spacer; and forming another portion of the second isolation part by filling a dielectric material inside the dummy spacer.

According to an embodiment, the first gate structure, the second gate structure, and the dummy gate structure may be sacrificial gate structures. In this case, the method may further comprise removing the first gate structure and the second gate structure in the process of removing the dummy gate structure. Selectively etching the first semiconductor layer may comprise selectively etching the first semiconductor layer which is exposed due to the removing of the dummy gate structure, the first gate structure, and the second structure. Forming a portion of the second isolation part may further comprise: forming a third isolation part by filling the dielectric material into a space due to the selective etching of the first semiconductor layer under the second semiconductor layer inside the first gate spacer; and forming a fourth isolation part by filling the dielectric material into a space due to the selective etching of the first semiconductor layer under the second semiconductor layer inside the second gate spacer. The method may comprise, after forming the portion of the second isolation part, the third isolation part, and the fourth isolation part, forming replacement gate structures in the respective spaces inside the dummy spacer and the first and second gate spacers, and removing the replacement gate structure inside the dummy spacer to expose the fin structure for selective etching of the fin structure.

According to an embodiment, the method may further comprise forming a further semiconductor layer which is at least partially embedded in the fin structure on opposite sides of the first gate spacer and/or the second gate spacer.

According to an embodiment, the selective etching of the first semiconductor layer may stop laterally at the further semiconductor layer. The further semiconductor layer may have a stack structure.

According to an embodiment, the method may further comprise forming an insulating spacer on sidewalls of a trench inside the dummy spacer resulting from the selective etching of the fin structure.

According to an embodiment, the method may further comprise, after selectively etching the fin structure and before forming the insulating spacer, removing the portion of the second isolation part.

According to an embodiment, exposing the first semiconductor layer inside the dummy spacer may comprise selectively etching the first isolation part to at least partially expose sidewalls of the first semiconductor layer.

According to yet another aspect of the present disclosure, a method of manufacturing a semiconductor arrangement is provided. The method comprises: forming a fin structure on a substrate; forming a first isolation part around the fin structure on opposite sides of the fin structure; forming, on the first isolation part, a dummy gate structure intersecting the fin structure, and forming, on opposite sides of the dummy gate structure, a first gate structure and a second gate structure intersecting the fin structure respectively; forming a first gate spacer, a second gate spacer, and a dummy spacer on sidewalls of the first gate structure, the second gate structure, and the dummy gate structure, respectively; forming a trench downwards inside the dummy spacer; isotropically etching a bottom portion of the trench to deepen the trench and expanding a lower portion of the trench; and forming an isolation part by filling the trench with a dielectric material to.

According to an embodiment, forming a trench may comprise: forming a mask layer to shield a region of a first semiconductor device corresponding to the first gate structure and a region of a second semiconductor device corresponding to the second gate structure; selectively etching the dummy gate structure with respect to the dummy spacer, and further performing selective etching downwards to form an upper portion of the trench; and forming an insulating spacer on inner walls of the upper portion of the trench.

According to an embodiment, forming an isolation part may comprise filling the trench with a dielectric material, wherein the dielectric material extends along sidewalls of the trench at the lower portion of the trench to form a hollow structure.

According to an embodiment, forming an isolation part may further comprise: removing the dielectric material filled in the upper portion of the trench; and further filling the trench with the dielectric material to fill up the trench with the dielectric material.

According to yet another aspect of the present disclosure, an electronic device is provided. The electronic device comprises the semiconductor arrangement described above.

According to an embodiment, the electronic device may comprise a smart phone, a computer, a tablet, an artificial intelligence device, a wearable device, or a mobile power supply.

According to embodiments of the present disclosure, it is possible to form an isolation part, such as STI, self-aligned to the space defined by the dummy gate spacer. As a result, each isolation needs only one dummy gate, and thus the footprint of the isolation part can be reduced. In addition, during the formation of the isolation, the overlay in patterning or lithography is improved and thus the manufacturing cost is reduced. The technology of the present disclosure is especially applicable to FinFETs.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1A:
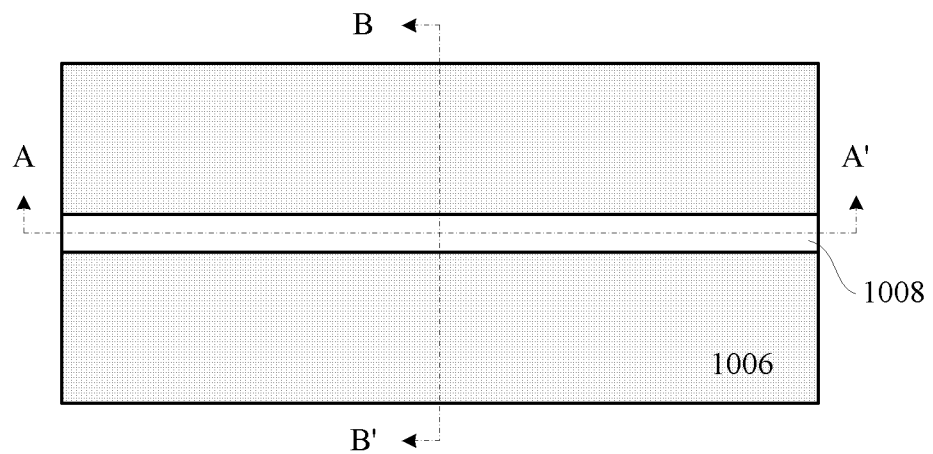
FIGS. 1(a)-22 are schematic views illustrating some steps of a process of manufacturing a semiconductor arrangement in accordance with an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to an embodiment of the present disclosure, a semiconductor arrangement is provided. The semiconductor arrangement is manufactured, for example, on a bulk semiconductor substrate. The semiconductor arrangement may comprise a first semiconductor device and a second semiconductor device disposed adjacent to each other on the substrate. Such semiconductor devices may comprise Fin Field Effect Transistors (FinFETs), for example. In this case, each of the semiconductor devices may comprise a fin and a gate stack intersecting the fin. For example, the fin may be achieved by patterning the substrate. In some examples, the first semiconductor device and the second semiconductor device may share a common fin. Further, on sidewalls of the gate stack, a gate spacer may be formed.

In order to electrically isolate the first semiconductor device from the second semiconductor device (if required), an isolation part, may be formed therebetween. Such an isolation part may be self-aligned to a space defined by a dummy gate spacer (in its inner side) disposed between the first semiconductor device and the second semiconductor device. Such a self-aligned isolation part may be formed by performing etching with the dummy gate spacer as a mask to form a trench (thus having sidewalls extending substantially along inner walls of the dummy gate spacer), and then filling a dielectric material into the trench.

For example, the dummy gate spacer may be manufactured according to the same process as that for the respective gate spacers of the first semiconductor device and the second semiconductor device. Further, a dummy gate stack may be formed according to the same process as that for the respective gate stacks of the first semiconductor device and the second semiconductor device. In other words, a dummy device (comprising the dummy gate stack and the dummy gate spacer) similar to the first and/or second semiconductor devices may be formed between the first semiconductor device and the second semiconductor device. These devices (including the dummy device) may have substantially the same gate stacks and gate spacers, and their gate stacks and thus gate spacers may be substantially aligned with each other.

In a case where the first semiconductor device and the second semiconductor device share a common fin, the dummy gate structure may intersect the fin to form a dummy FinFET. That is, three devices (including one dummy device) that intersect the common fin may be formed. In this case, a dummy gate isolation part (or a trench) may extend to penetrate the fin, such that respective active regions of the first semiconductor device and the second semiconductor device may be isolated from each other.

Source/drain regions of the respective semiconductor devices may be formed on opposite sides of the respective gate stacks in the substrate (formed in the fin in a case of FinFET, for example). In an example, a further semiconductor layer which is at least partially embedded into the fin may be formed, and the source/drain regions may be formed at least partially in the further semiconductor layer. The further semiconductor layer may comprise a material different from that of the substrate, to apply stress to a channel region. For example, for an N-type device, tensile stress may be applied; and for a P-type device, compressive stress may be applied.

The present disclosure can be presented in various ways, some of which will be illustrated in the following.

FIGS. 1(a)-22 are schematic views illustrating some steps of a process of manufacturing a semiconductor arrangement in accordance with an embodiment of the present disclosure.

Figure 1B:
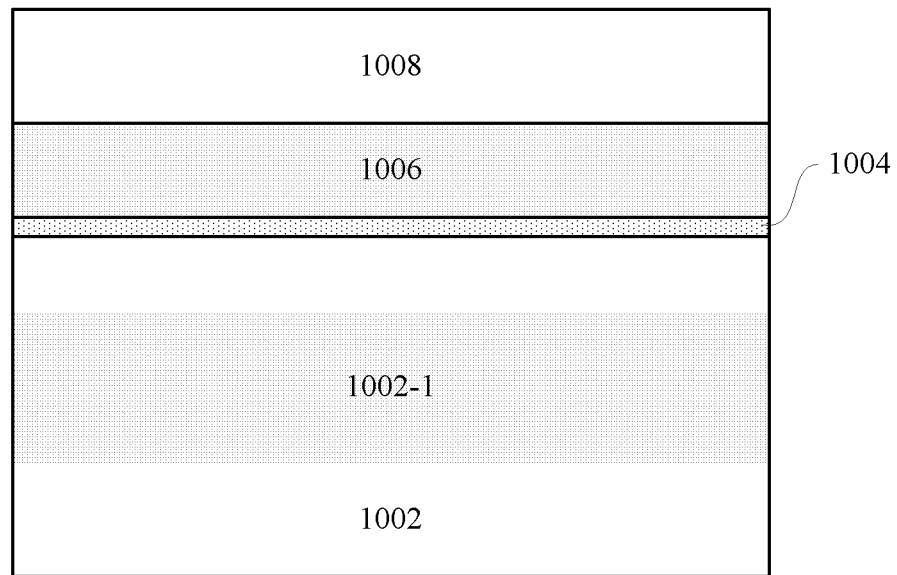
Figure 1C:
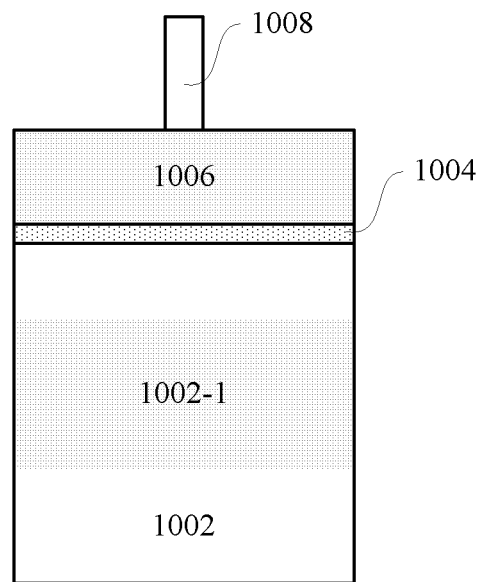

As shown in FIGS. 1(a), 1(b) and 1(c) (FIG. 1(a) is a top view, FIG. 1(b) is a cross sectional view taken along line AA' in FIG. 1(a), and FIG. 1(c) is a cross sectional view taken along line BB' in FIG. 1(a)), a bulk substrate 1002 is provided. The substrate may comprise any suitable bulk semiconductor material, such as Si, Ge, SiGe, or the like. Hereinafter, silicon system materials are described by way of example, but the present disclosure is not limited thereto.

In the substrate 1002, a well region 1002-1 may be formed by, for example, ion implantation. For example, for a P-type device, an N-type well region may be formed; and for an N-type device, a P-type well region may be formed. For example, the N-type well region may be formed by implanting N-type dopants, such as P or As, into the substrate 1002, and the P-type well region may be formed by implanting P-type dopants, such as B, into the substrate 1002. If needed, annealing may be performed after the implantation. One skilled in the art may contemplate various ways to form an N-type well and/or a P-type well, and thus detailed descriptions thereof are omitted for simplicity.

On the substrate 1002, a mask layer may be formed by, for example, deposition. The mask layer may comprise a stack of an oxide layer 1004 (such as, silicon oxide) with a thickness of about 5-20 nm and a nitride layer 1006 (such as, silicon nitride) with a thickness of about 50-150 nm. On the mask layer, photoresist 1008 may be formed. The photoresist 1008 may be patterned into a fin-like shape by, for example, photolithography, to facilitate forming a fin structure on the substrate subsequently.

Figure 2A:
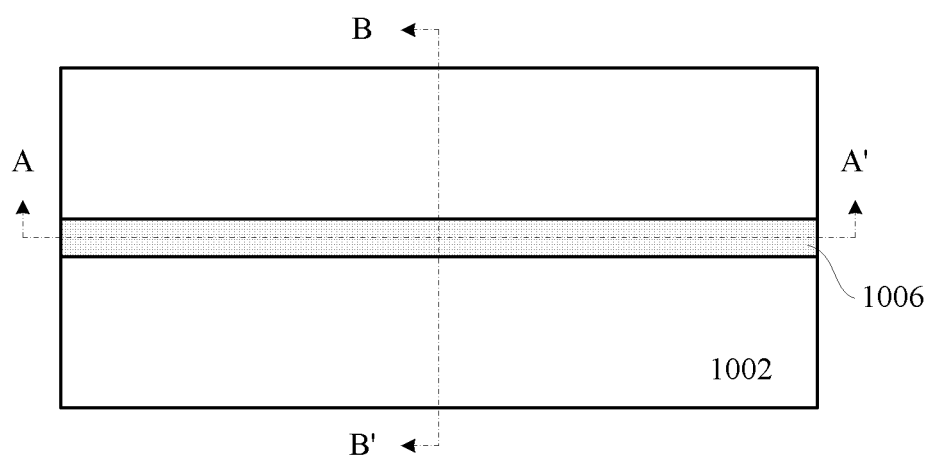
Figure 2B:
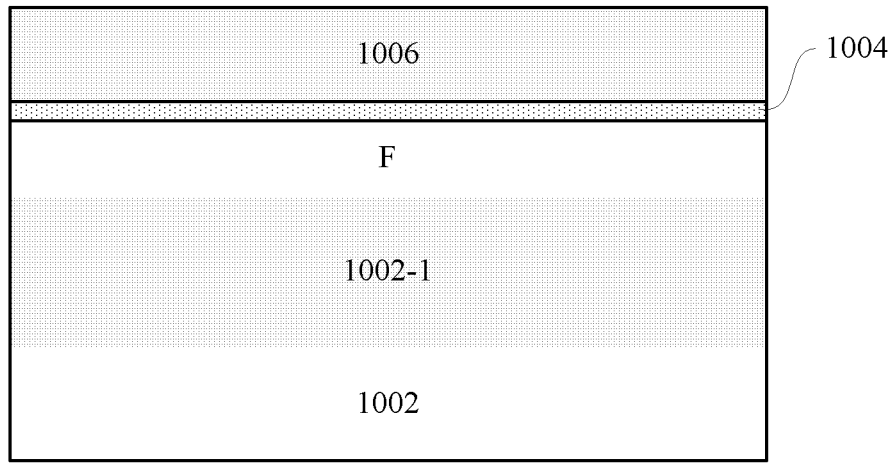
Figure 2C:
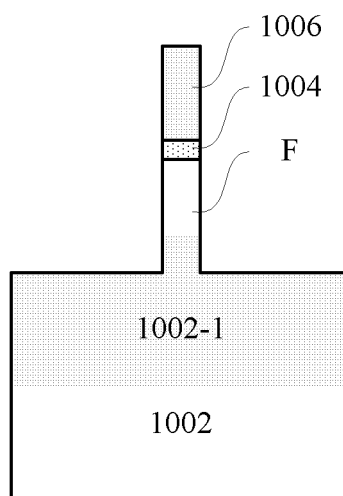

Next, as shown in FIGS. 2(a), 2(b) and 2(c) (FIG. 2(a) is a top view, FIG. 2(b) is a cross sectional view taken along line AA' in FIG. 2(a), and FIG. 2(c) is a cross sectional view taken along line BB' in FIG. 2(a)), the mask layer and the substrate 1002 may be selectively etched in sequence by, for example, Reactive Ion Etching (ME), with the photoresist 1008 as a mask, thereby forming a fin structure F. More specifically, trenches are formed in the substrate 1002 by RIE, and a portion of the substrate between the trenches relatively protrudes, thereby forming the fin structure F. The RIE may be performed, for example, in a direction substantially perpendicular to a surface of the substrate, such that the resultant fin structure F may extend substantially vertically with respect to the surface of the substrate. After that, the photoresist 1008 may be removed.

In this example, the fin structure is formed by directly patterning the substrate. However, the present disclosure is not limited thereto. For example, an epitaxial layer may be formed on the substrate, and the fin structure may be formed by patterning the epitaxial layer. In the present disclosure, the expression "forming a fin structure on a substrate" means forming a fin structure on a substrate in any appropriate manner, and the expression "a fin structure formed on a substrate layer" means any fin structure which is formed on a substrate in any appropriate manner.

Further, in the example shown in FIGS. 2(a), 2(b) and 2(c), in forming the fin structure F, the selective etching enters into the well region 1002-1. However, the present disclosure is not limited thereto. A position at which the selective etching stops may be determined according to practical requirements. For example, the selective etching may stop at a top surface of the well region 1002-1.

Figure 3:
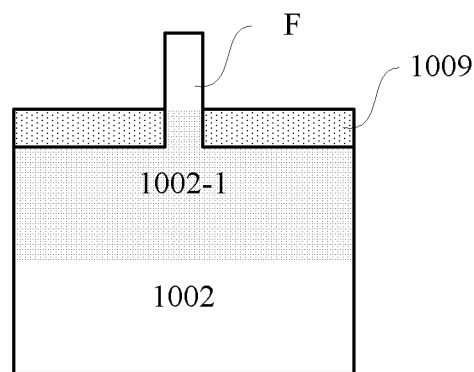

This fin structure F may then sever as an active region of the device. As shown in FIG. 3 (a cross sectional view taken along line BB'), an isolation layer 1009 (which may be referred to as a "first isolation part"), such as Shallow Trench Isolation (STI), may be disposed around the active region. For example, the STI may be formed by depositing oxide on the substrate 1002 with the fin structure F formed thereon and etching back the oxide. The oxide may be planarized by, for example, Chemical Mechanical Polishing (CMP), prior to the back-etching. In the planarization process, mask layers (1004/1006) on top of the fin structure F may be removed. The fin structure F protrudes with respect to a top surface of the isolation layer 1009, and a protruding portion of the fin structure F may then be used as a fin of the device.

In the example, the top surface of the isolation layer 1009 may be substantially flush with the top surface of the well region 1002-1. However, the present disclosure is not limited thereto. For example, the top surface of the isolation layer 1009 may be (slightly) higher or (slightly) lower than the top surface of the well region 1002-1.

Further, in order to suppress punch-through, a punch-through stopper may be formed in a bottom portion of the fin structure F (particularly, a portion below the top surface of the isolation layer 1009). For example, ions may be implanted in a direction substantially perpendicular to the surface of the substrate, and the implanted ions are scattered into the bottom portion of the fin structure F by the isolation layer 1009 to form the punch-through stopper. Annealing may be performed to activate the implanted ions.

After forming the fin structure F and the isolation layer 1009 as described above, processes for manufacturing devices, such as forming gate stacks, forming source/drain, or the like, may be performed.

Figure 4A:
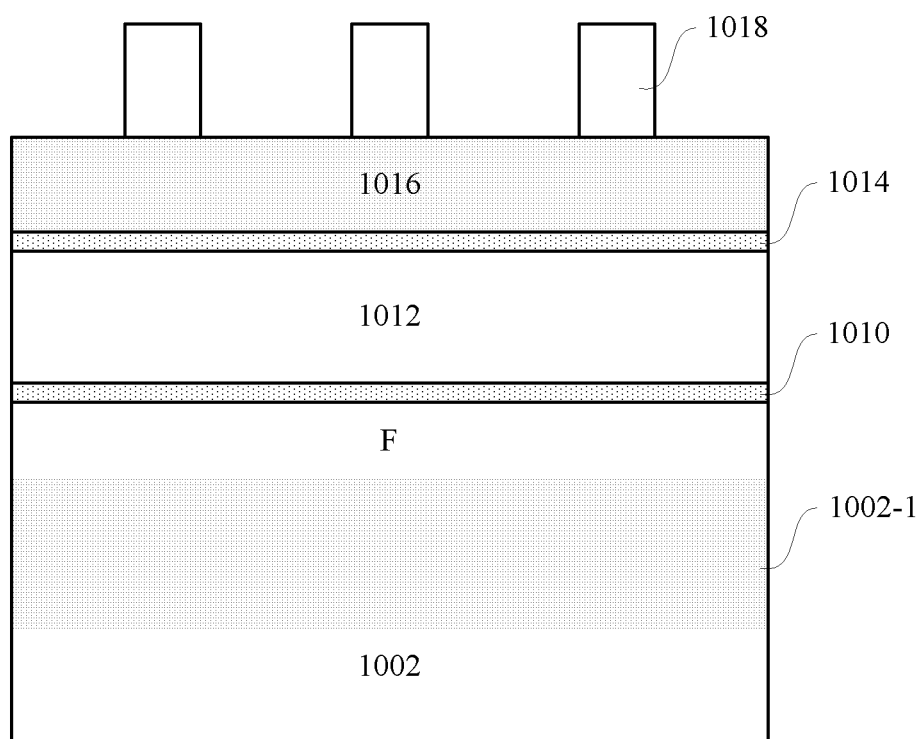
Figure 4B:
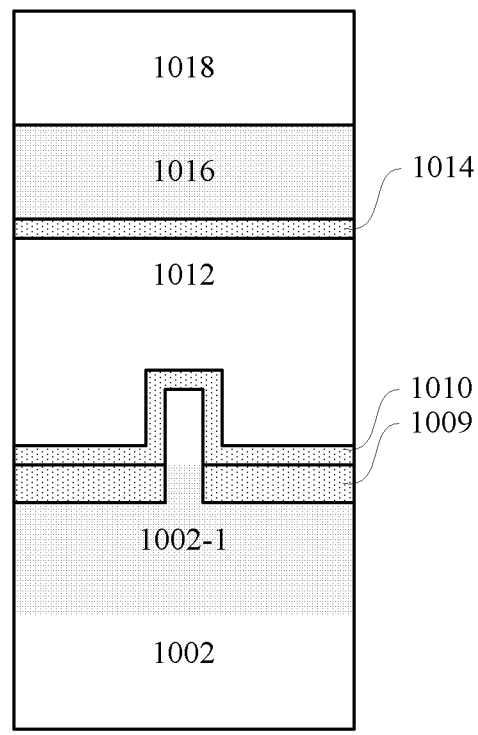

In particular, as shown in FIGS. 4(*a*) and 4(*b*) (cross sectional views taken along line AA' and line BB' respectively), a sacrificial gate dielectric layer 1010 and a sacrificial gate conductor layer 1012 may be formed in sequence on the substrate by, for example, deposition. For example, the sacrificial gate dielectric layer 1010 comprises oxide with a thickness of about 1-5 nm, and the sacrificial gate conductor layer 1012 comprises poly-silicon or amorphous silicon with a thickness of about 50-150 nm. If needed, the deposited sacrificial gate conductor layer 1012 may be planarized by, for example, CMP. After that, a mask layer may be formed on the sacrificial gate conductor layer 1012 by, for example, deposition. The mask layer may comprise a stack of an oxide layer 1014 with a thickness of about 3-5 nm and a nitride layer 1016 with a thickness of about 50-150 nm. On the mask layer, photoresist 1018 may be formed. The photoresist 1018 may be patterned by, for example, photolithography, into a pattern corresponding to the gate stacks to be formed (referring to FIG. 5(*a*), in this example, patterned into three substantially parallel straight strips).

Figure 5A:
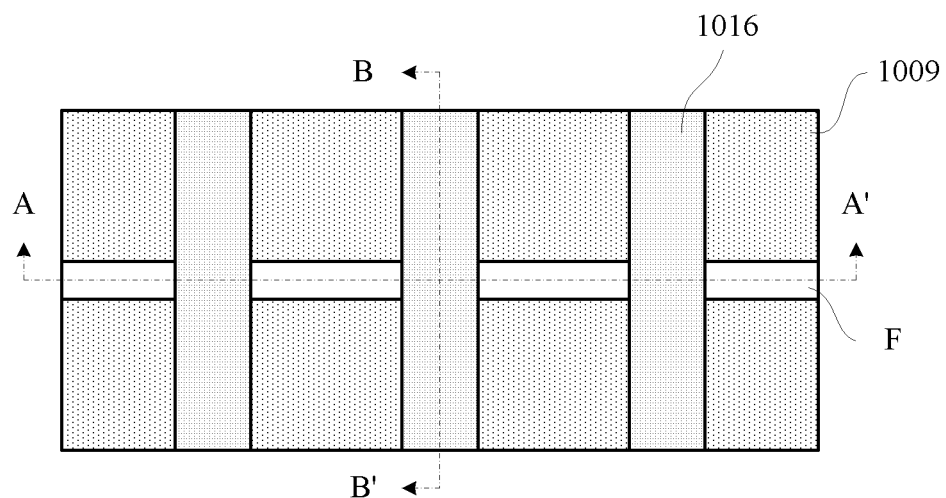
Figure 5B:
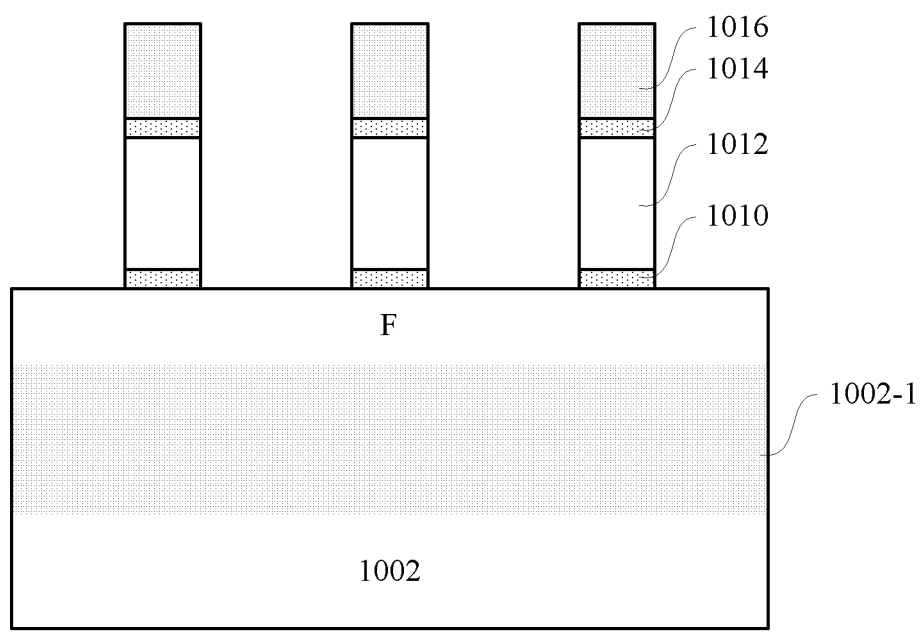
Figure 5C:
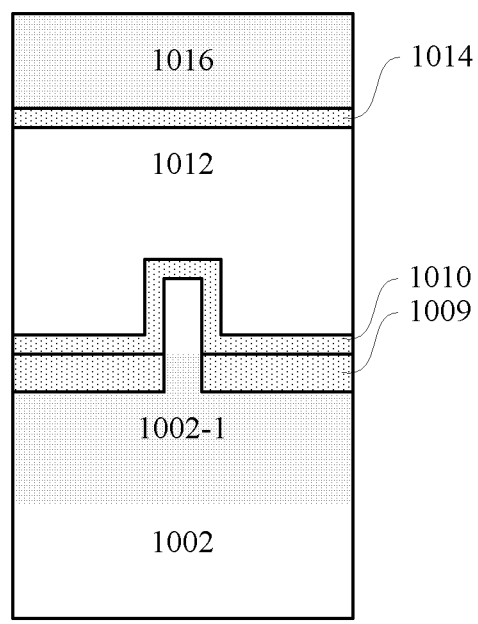

After that, as shown in FIGS. 5(*a*), 5(*b*) and 5(*c*) (FIG. 5(*a*) is a top view, FIG. 5(*b*) is a cross sectional view taken along line AA' in FIG. 5(*a*), and FIG. 5(*c*) is a cross sectional view taken along line BB' in FIG. 5(*a*)), the nitride layer 1016, the oxide layer 1014, the sacrificial gate conductor layer 1012, and the sacrificial gate dielectric layer 1010 may be selectively etched in sequence by, for example, RIE, with the photoresist 1018 as a mask. The RIE may stop at the isolation layer 1009. Subsequently, the photoresist 1018 may be removed. In this way, three strip-like gate structures are formed. Here, the so-called "gate structure" refers to one or more layers in the (sacrificial) gate stack or the (sacrificial) gate stack itself. For example, in the example as shown in the figure, the gate structure may refer to the sacrificial gate conductor layer 1012 and the sacrificial gate dielectric layer 1010 after being patterned (that is, the sacrificial gate stack itself).

In the example, the gate structures on left and right sides are then used to form devices, and the middle gate structure is not really used to form any device, and may therefore be referred to as a "dummy" gate structure.

Figure 6:
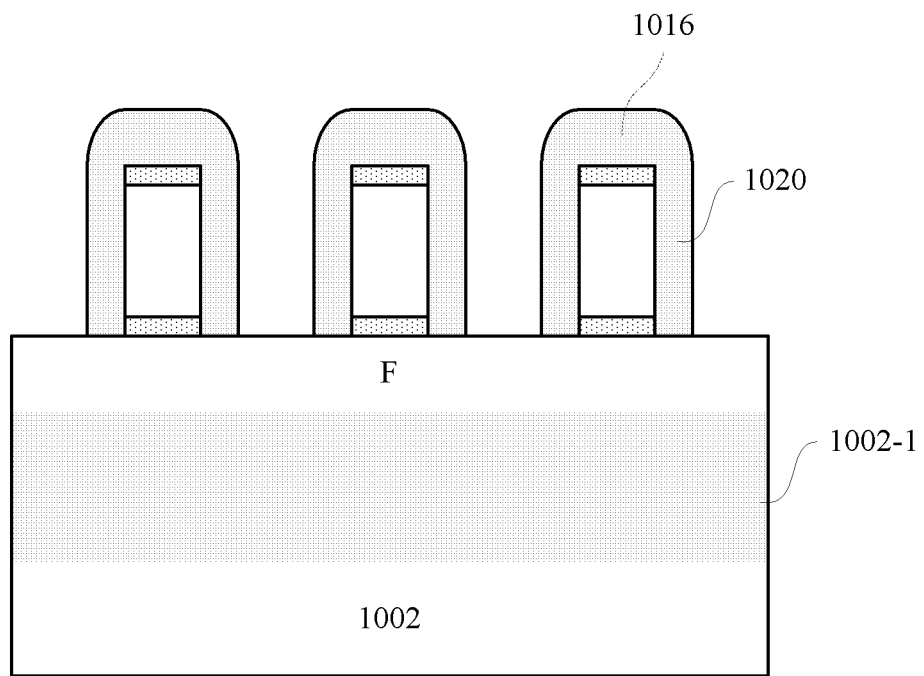

Subsequently, as shown in FIG. 6 (a cross sectional view taken along line AA'), gate spacers 1020 may be formed on sidewalls of the respective gate structures. One skilled in the art knows various ways to form such spacers. For example, a layer of nitride may be deposited on the structure shown in FIGS. 5(*a*), 5(*b*) and 5(*c*) in a substantially conformal way, and then RIE may be performed on the layer of nitride in a substantially vertical direction to form the spacers 1020. The spacers 1020 each may have a width of about 5-30 nm (in a dimension in a horizontal direction in the figures). Here, the mask layer on top of the gate structures is not removed, mainly for the purpose of protecting the gate structures in subsequent processes. In this example, because both the nitride layer 1016 and the spacers 1020 comprise nitride, they are shown as a whole in the figures.

Figure 7:
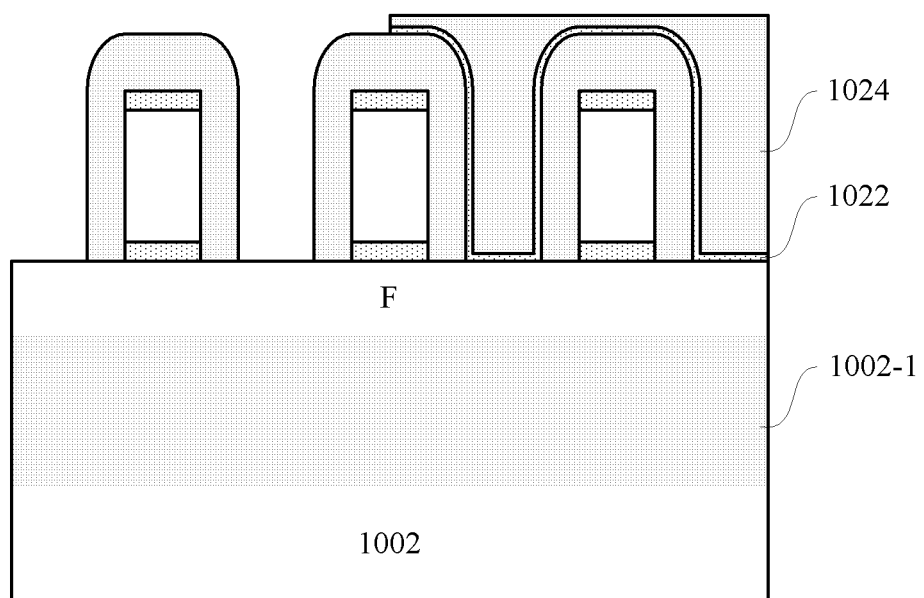

Here, a case where one P-type device and one N-type device are formed is described. In this case, as shown in FIG. 7 (a cross sectional view taken along line AA'), a region for the N-type device (the right region in the figure) may be masked by a mask layer. For example, the mask layer may comprise an oxide layer 1022 with a thickness of about 3-10 nm and a nitride layer 1024. This mask layer may extend onto a top surface of the middle gate structure, and expose a region for the P-type device (the left region in the figure).

Although a case where one P-type device and one N-type device, two devices in total, are formed is described here, the present disclosure is not limited thereto. The technology of the present disclosure is also applicable to form more or less semiconductor devices of the same type or different types.

Figure 8:
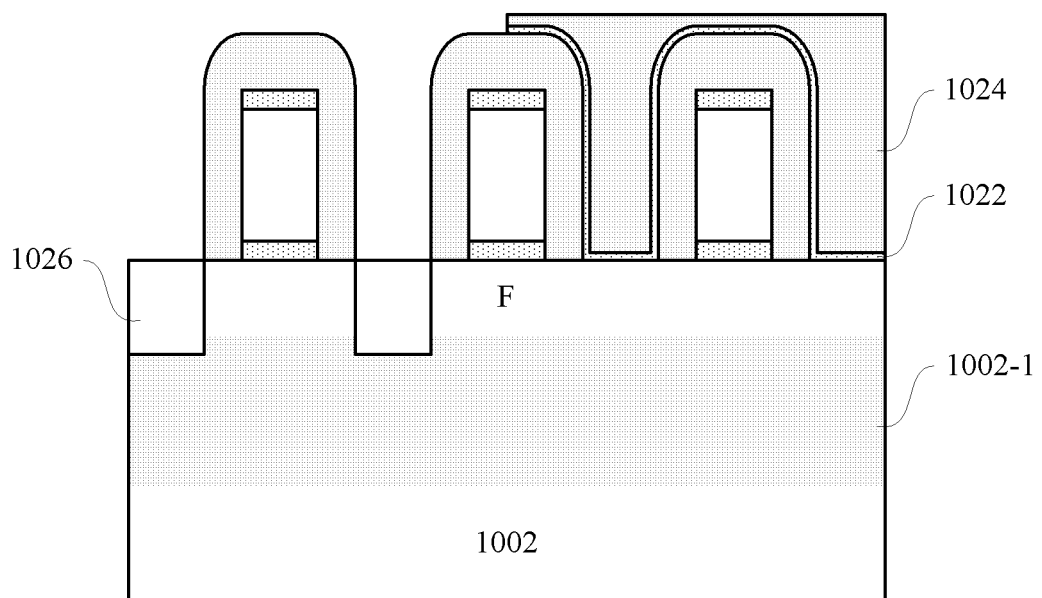

After that, as shown in FIG. 8 (a cross sectional view taken along line AA'), for the P-type device, a further semiconductor layer 1026 which is at least partially embedded into the fin structure F may be formed on opposite sides of the gate structure. In this example, the fin structure F is integral with the substrate 1002, and the semiconductor layer 1026 may even enter into the substrate 1002. The semiconductor layer 1026 may comprise a material different from that of the substrate 1002, for example, SiGe (with an atomic percentage of Ge of, for example, about 35-75%, and preferably, changed gradually), to apply compressive stress to a channel region. Such an embedded semiconductor layer may be formed, for example, as follows. Specifically, the fin structure F may be selectively etched by, for example, RIE, with the sacrificial gate structure (in this example, with the nitride layer disposed on a top surface thereof) and the gate spacer (in this example, nitride) as a mask (and the etching may enter into the substrate 1002), to form a trench. Subsequently, the trench may be filled (by, for example, selective epitaxial growth followed by etching-back) with a semiconductor material, such as, SiGe. The mask layer on the top surface of the sacrificial gate conductor layer can prevent the sacrificial gate conductor layer from being damaged when the fin structure F is being selectively etched (in this example, both the sacrificial gate conductor layer and the fin structure comprise silicon).

In the figures, the semiconductor layer 1026 is shown to have a top surface flush with that of the fin structure F. However, the present disclosure is not limited thereto. For example, depending on the amount of the etching-back, the top surface of the semiconductor layer 1026 may be higher or lower.

The semiconductor material may be in-situ doped when it is being grown. For example, P-type doping may be performed for the P-type device, with a doping concentration of about 1E19-1E22 cm$^{-3}$. The in-situ doped semiconductor layer 1026 may then form source/drain regions of the semiconductor device. After that, the mask layer 1022 and 1024 may be removed by selective etching, such as, RIE.

Figure 9:
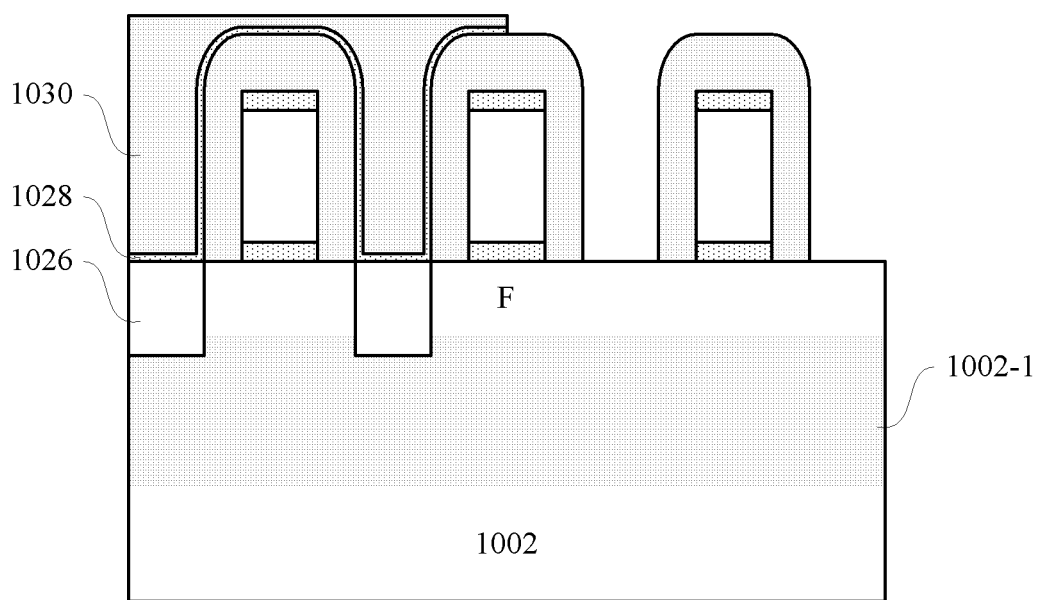

Likewise, similar processes may be performed on the N-type device on the other side. For example, as shown in FIG. 9 (a cross sectional view taken along line AA'), the region for the P-type device may be masked by a mask layer. For example, the mask layer may comprise an oxide layer 1028 with a thickness of about 3-10 nm and a nitride layer 1030. The mask layer may extend onto the top surface of the middle gate structure, and expose the region for the N-type device.

Figure 10:
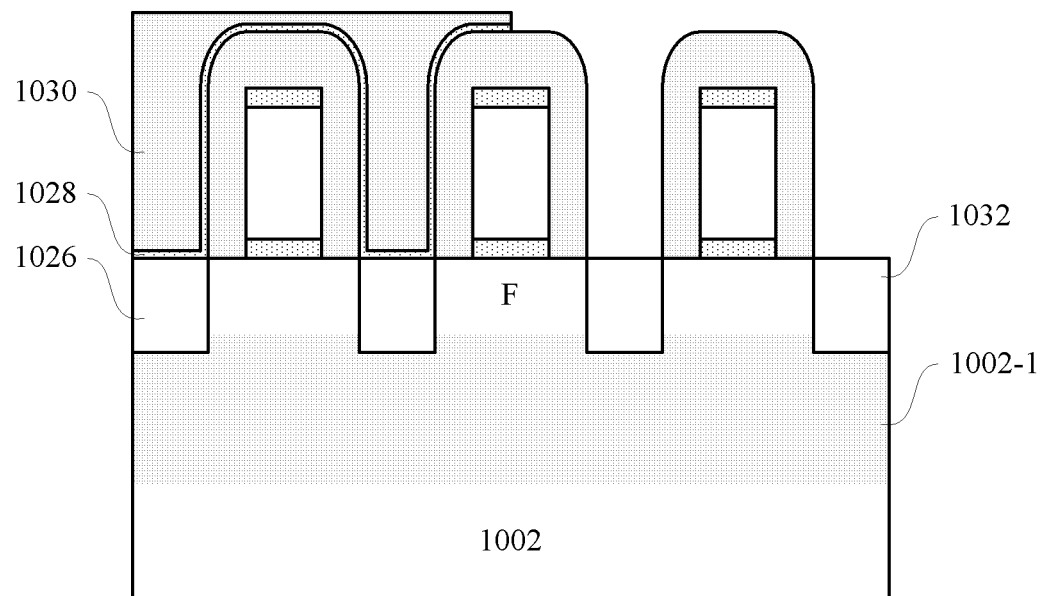

After that, as shown in FIG. 10 (a cross sectional view taken along line AA'), a further semiconductor layer 1032 which is at least partially embedded into the fin structure F may also be formed on opposite sides of the gate structure of the N-type device. In this example, the fin structure F is integral with the substrate 1002, and the semiconductor layer 1032 may even enter into the substrate 1002. The semiconductor 1032 may comprise a material different from that of the substrate 1002, for example, Si:C (with an atomic percentage of C of, for example, about 0.32%), to apply tensile stress to a channel region. Such an embedded semiconductor layer may be formed, for example, as described above. The semiconductor material may be in-situ doped when it is being grown. For example, N-type doping may be performed for the N-type device. The in-situ doped semiconductor layer 1032 may then form source/drain regions of the semiconductor device. After that, the mask layer 1030 and 1028 may be removed by selective etching, such as, RIE.

Although an example in which embedded source/drain regions are epitaxially grown is described, the present disclosure is not limited thereto. For example, the source/drain regions may be formed by directly implanting ions into the fin F.

After that, a gate replacement process may be performed.

Figure 11:
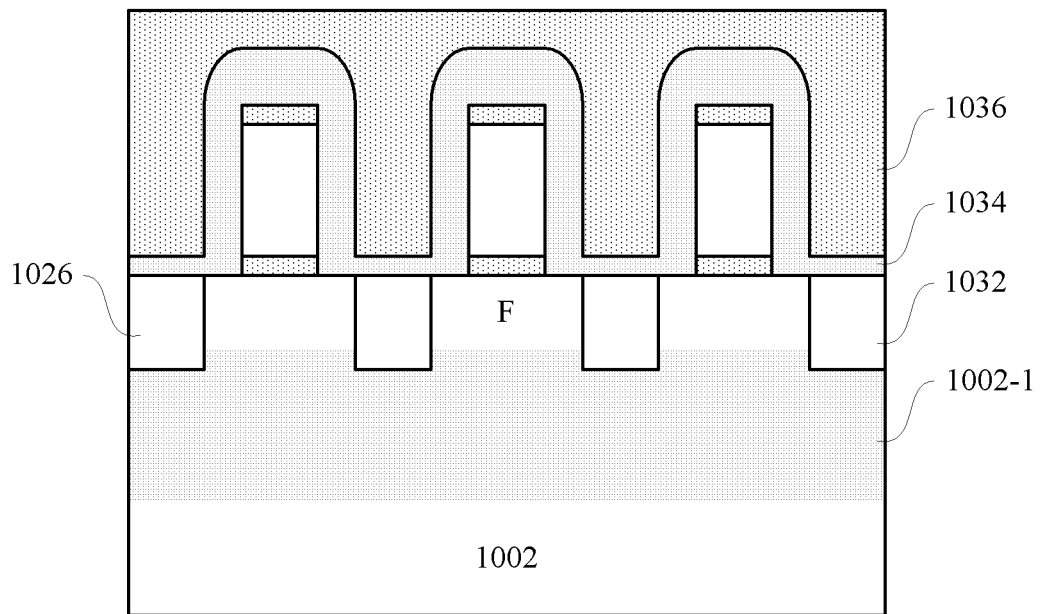

For example, as shown in FIG. 11 (a cross sectional view taken along line AA'), an interlayer dielectric layer 1036 may be formed on the substrate by, for example, deposition. The interlayer dielectric layer 1036 may comprise oxide with a thickness sufficient to fill up the space between respective gate structures. Further, an etching stop liner 1034 may be formed firstly by, for example, deposition. The etching stop liner 1034 may comprise nitride with a thickness of about 5-20 nm. In this example, because the etching stop liner 1034, the gate spacers 1020, and the nitride layer 1016 in the mask all comprise nitride, they are shown as a whole. Furthermore, for convenience of drawing, the gate spacers 1020 and the nitride layer 1016 in the mask are not shown to be increased in thickness due to the deposited etching stop liner 1034.

Figure 12:
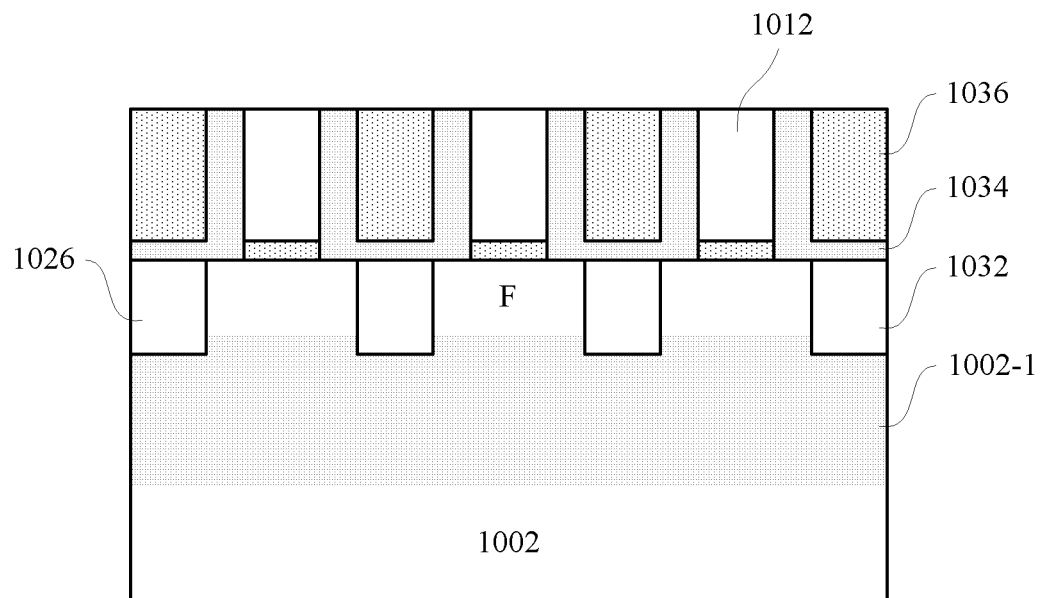
Figure 13:
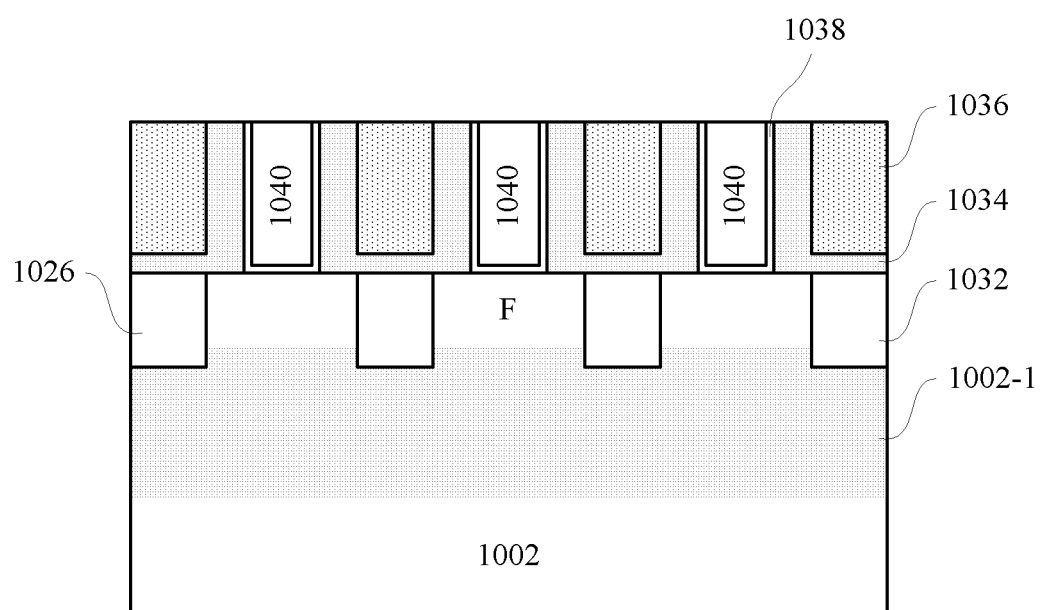

Subsequently, as shown in FIG. 12 (a cross sectional view taken along line AA'), a planarization process, such as, CMP, may be performed until the sacrificial gate structures are exposed. In particular, the sacrificial gate conductor layer 1012 is exposed. The sacrificial gate conductor layer 1012 may be removed by selective etching, for example, wet etching with a TMAH solution. The sacrificial gate dielectric layer 1010 may be further removed by selective etching, for example, wet etching with an HF solution or a BOE solution. In this way, trenches are formed inside the respective gate spacers 1020. After that, as shown in FIG. 13 (a cross sectional view taken along line AA'), replacement gate stacks may be formed in the respective trenches (by, for example, deposition followed by planarization). In particular, the replacement gate stacks each may comprise a replacement gate dielectric layer 1038 and a replacement gate conductor layer 1040. The replacement gate dielectric layer 1038 may comprise a high-K gate dielectric material, such as, HfO$_2$, with a thickness of about 2-4 nm, and the replacement gate conductor layer 1040 may comprise a metal gate conductor, such as, any one of TiN, TiAl, TaN, or TiC, or a combination thereof. For the N-type device and the P-type device, the replacement gate conductor layer 1040 may comprise materials with different work functions. Further, before the replacement gate stacks are formed, an interface layer (for example, oxide) with a thickness of about 0.3-1.5 nm may be formed.

Figure 14:
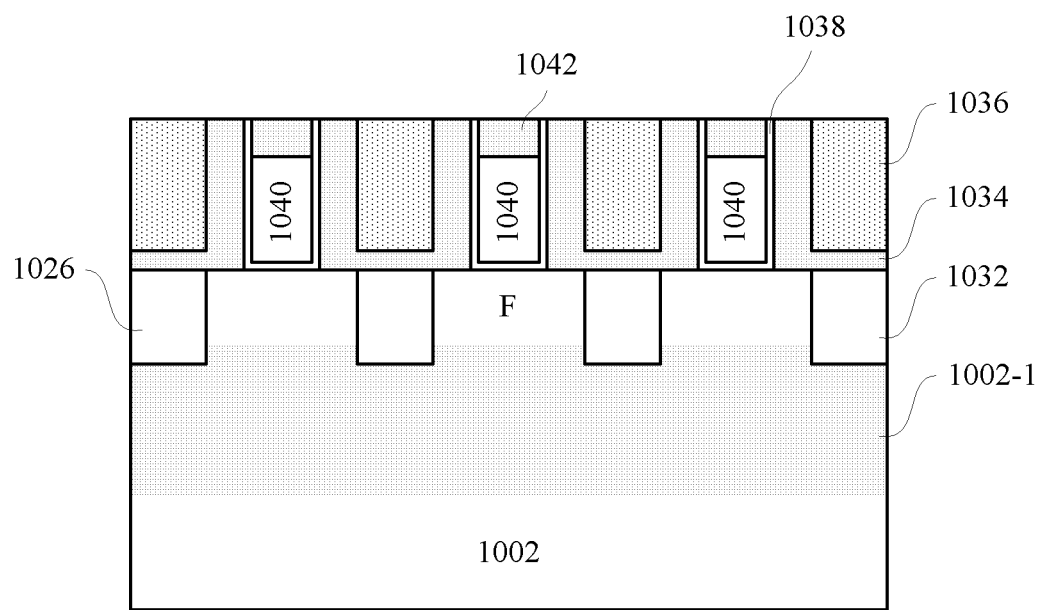

In an example of the present disclosure, the replacement gate conductor layer 1040 may be recessed downwardly, and then a dielectric material may be filled on top thereof. For example, as shown in FIG. 14 (a cross sectional view taken along line AA'), a part of the replacement gate conductor layer 1040 may be removed by selective etching, such as, RIE, and then spaces inside the respective gate spacers 1020, due to removal of the part from the top of the replacement gate conductor layer 1040, may be filled (by, for example, deposition followed by planarization) with a dielectric layer 1042, for example, nitride.

Figure 15:
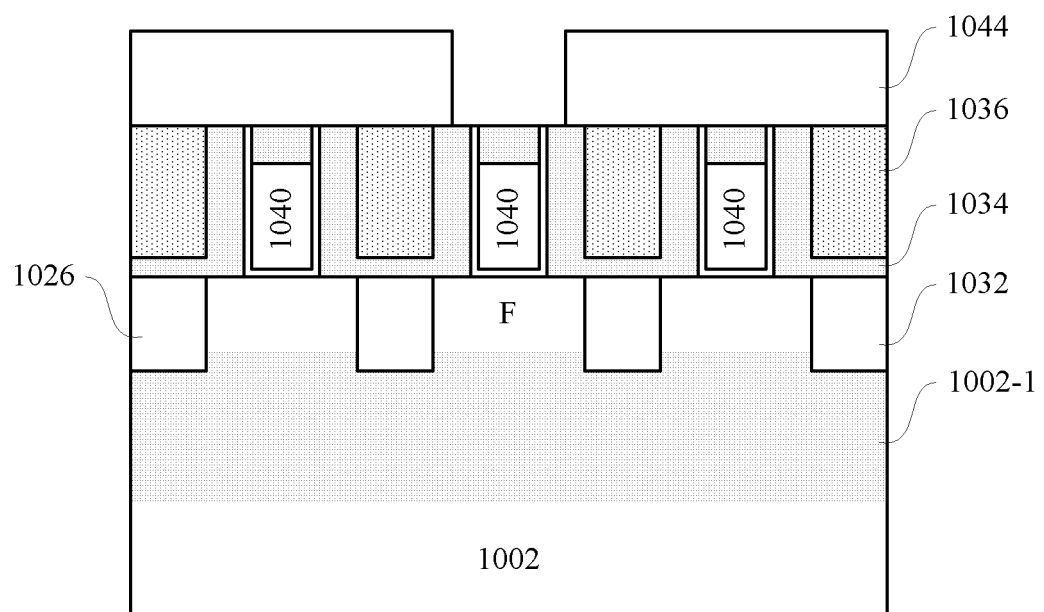
Figure 16:
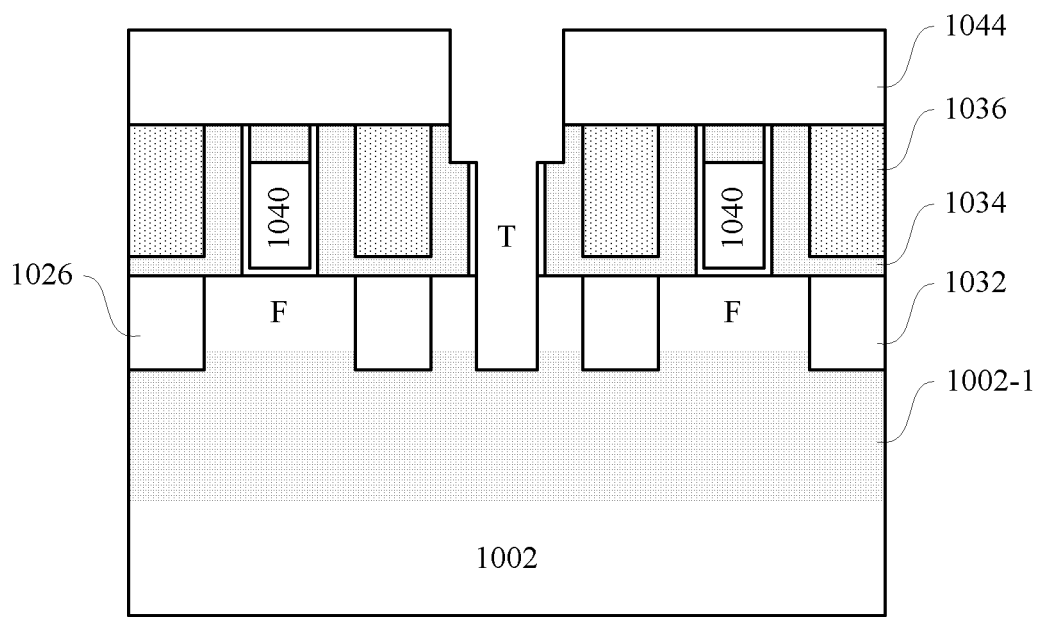

After that, as shown in FIG. 15 (a cross sectional view taken along line AA'), the region for the P-type device and the region for the N-type device may be masked by a mask layer 1044, for example, photoresist. For example, the mask layer 1044 may extend onto the top of the dummy gate spacer, and expose the region for the dummy gate stack. Subsequently, portions of the dielectric layer 1042, the replacement gate conductor layer 1040, the replacement gate dielectric layer 1038, and the fin structure F in this region may be removed in sequence by selective etching, for example, RIE, resulting in a trench T, as shown in FIG. 16 (a cross sectional view taken along line AA'). In this example, portions of the replacement gate dielectric layer 1038 on the sidewalls of the trench T are not removed. However, these portions of replacement gate dielectric layer 1038 may be also removed. After that, the mask layer 1044 may be removed.

Because the selective etching is performed with respect to the gate spacer 1020 (although in this embodiment, a part from its top may be removed when performing RIE on the dielectric layer 1042 of nitride), the trench T may be self-aligned to a space defined by the gate spacer 1020. In particular, the sidewalls of the trench T extends substantially along inner walls of the gate spacer 1020 (in this example, recessed inwardly by the thickness of the replacement gate dielectric layer 1038, and such a recess is negligible).

Figure 17:
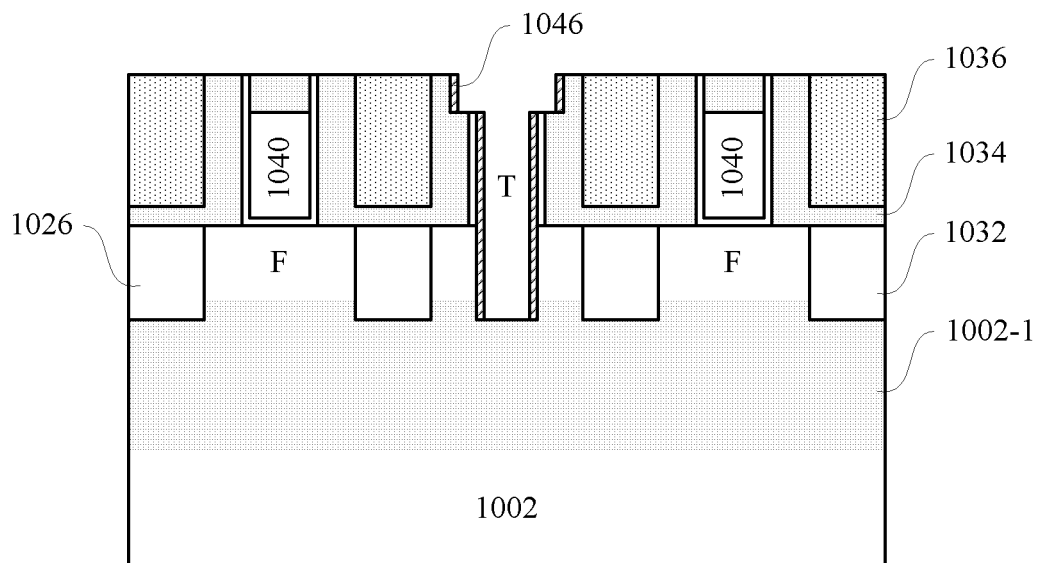

In order to suppress influences on the profile of sidewalls of an upper portion of the trench T when the trench T is being further expanded (in particular, widened), a suitable dielectric material, for example nitride or SiC, may be formed on the sidewalls of the trench T. For example, as shown in FIG. 17 (a cross sectional view taken along line AA'), a dielectric layer 1046 with a thickness of about 2-7 nm may be formed on the sidewalls of the trench T by a spacer formation process.

Figure 18:
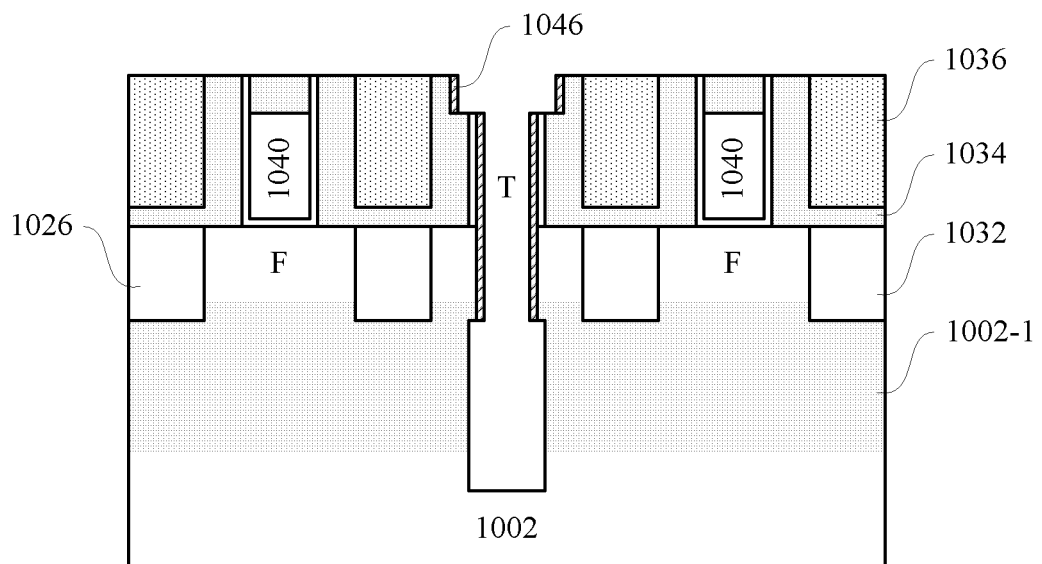

Then, as shown in FIG. 18 (a cross sectional view taken along line AA'), the trench may be further deepened through the bottom wall of the trench T. For example, RIE may continue to be performed on the substrate 1002 through the trench T such that the trench T is deepened. Then, the substrate 1002 may be further isotropically etched by, for example, wet etching through the deepened trench T, such that a lower portion of the trench T is widened. The upper portion of the trench T is not widened due to the presence of the dielectric layer 1046 on the sidewalls. Electrical insulating properties such as electrical breakdown, low k, or the like may be improved by the dielectric layer 1046.

Alternatively, after the dielectric layer 1046 is formed, the substrate 1002 may be directly isotropically etched through the bottom of the trench to simultaneously widen and deepen the trench T, instead of firstly deepening the trench T and then widening the trench T as described above.

It is advantageous to improve isolation between devices, for example, to reduce leakage current or short circuit between devices, by the deepened and widened trench.

Figure 19:
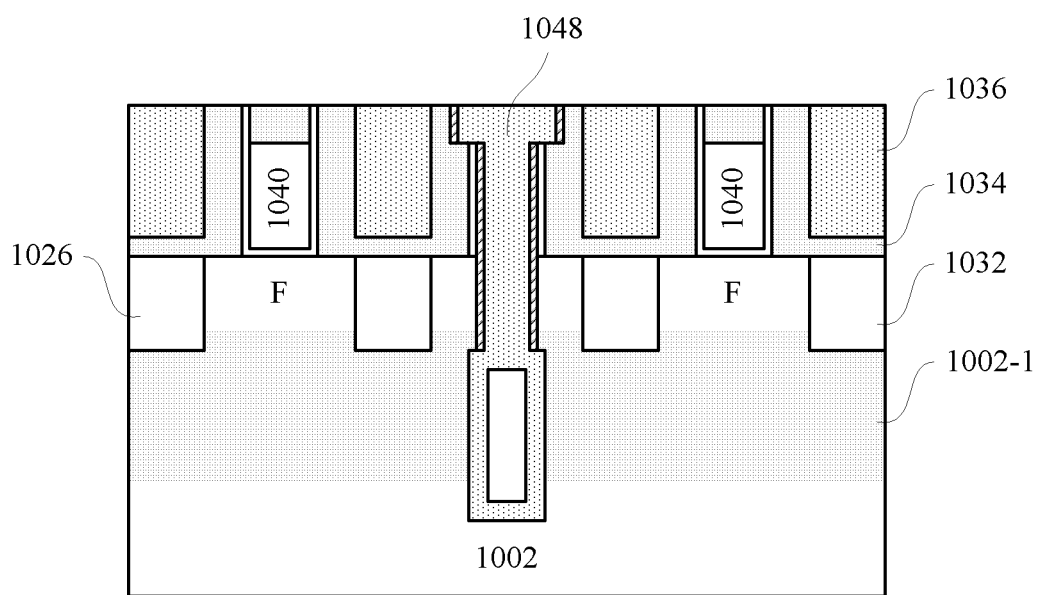

Next, as shown in FIG. 19 (a cross sectional view taken along line AA'), the trench T may be filled (by, for example, deposition followed by planarization) with a dielectric material, such as, oxide, to form an isolation part 1048 (which may be referred to as a "second isolation part".) Because the trench T is self-aligned to the space defined by the gate spacer 1020, the isolation part 1048 formed in the trench T is also self-aligned to the space defined by the gate spacer 1020.

In the example, because the trench T has a narrow upper portion and a wide lower portion, the isolation part 1048 may be formed along inner walls of the trench T at the lower portion of the trench T, and has a hollow structure to form an air gap. This air gap contributes to low k.

The fin structure F is divided by the trench T and the isolation part 1048 formed in the trench T into two portions electrically isolated from each other, serving as fins of the N-type device and the P-type device, respectively.

Figure 20:
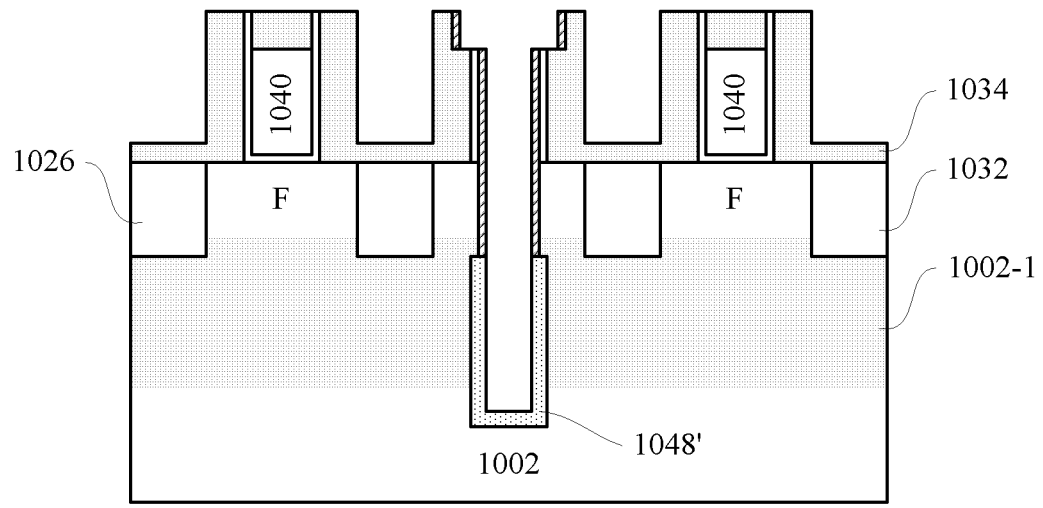
Figure 21:
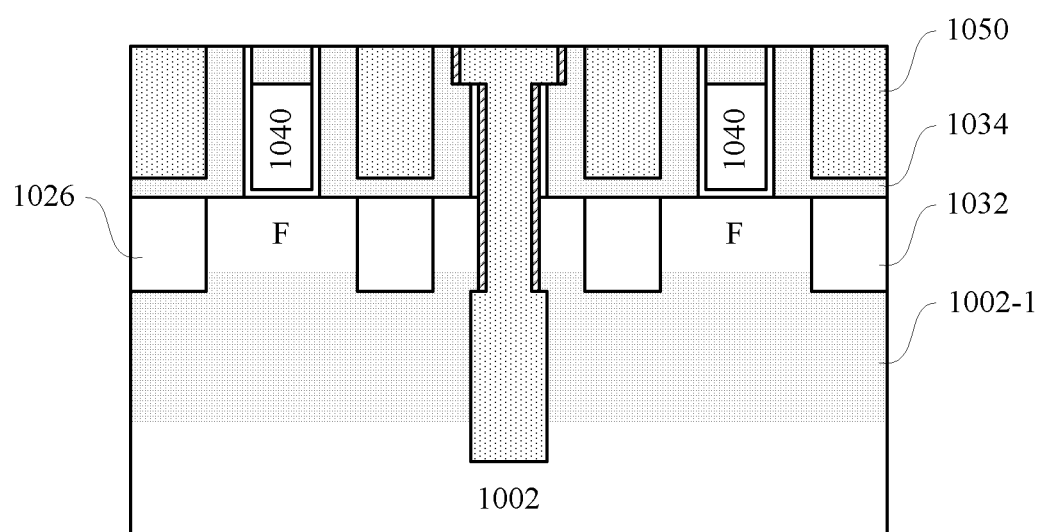

Of course, the present disclosure is not limited thereto, and the lower portion of the trench T may be filled up. For example, as shown in FIG. 20 (a cross sectional view taken along line AA'), after the hollow structure as shown in FIG. 19 is formed, the isolation part 1048 may be selectively etched by, for example, RIE. The RIE may be performed in a direction substantially perpendicular to the surface of the substrate, such that portions of the isolation part 1048 at the upper portion of the trench may be removed, while portions of the isolation part 1048 (shown as 1048') on sidewalls of the lower portion of the trench may be left. In the example, because the interlayer dielectric layer 1036 includes oxide like the isolation part 1048, the interlayer dielectric layer 1036 may also be removed during the RIE process. The trench may then continue to be filled with a dielectric material such as oxide. During the filling process, the hollow structure as shown in FIG. 19 may still appear. In this case, the operations described in conjunction with FIG. 20 may be performed again. Those filling and etching steps may be repeated until the trench T is filled up with dielectric. The filled dielectric may be planarized by, for example, CMP (which may stop at the dielectric layer 1042 on top of the gate conductor layer), such that the space between the gate spacers is also filled up, resulting in an interlayer dielectric layer 1050 again, as shown in FIG. 21 (a cross sectional view taken along line AA').

Figure 22:
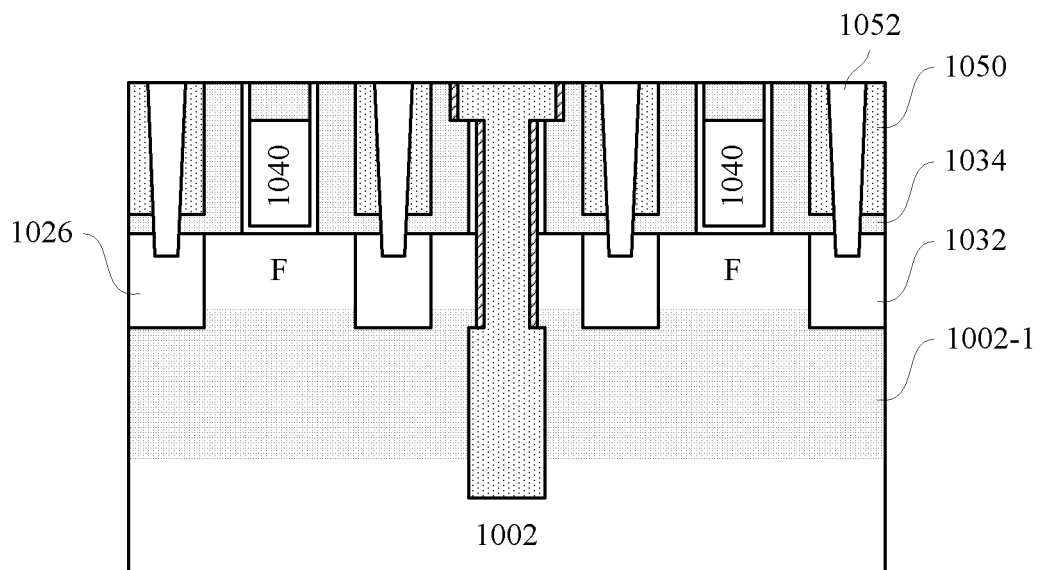

After the devices and the self-aligned isolation part are formed as described above, other peripheral components may be further formed. For example, as shown in FIG. 22, source/drain contacts 1052 may be formed. The source/drain contacts 1052 may be formed by etching contact holes and then filling the holes with a conducting material, such as, metal (for example, Cu or W). A diffusion barrier layer of, for example, TiN may also be formed on sidewalls of the contact holes before the conducting material is filled.

As shown in FIG. 22, the semiconductor arrangement according to this embodiment of the present disclosure may comprise the P-type device and the N-type device. Each of the devices may comprise a respective gate stack (comprising the replacement gate dielectric layer 1038 and the replacement gate conductor layer 1040) and the gate spacer 1020 disposed on the sidewalls of the gate stack. Between the two devices, the dummy gate spacer may be formed. As described above, the isolation part is self-aligned to the space defined by the dummy gate spacer. Due to the self-alignment, in the top view, the lower portion of the isolation part is symmetrical with respect to a longitudinally extending line of the space defined by the dummy gate spacer. The isolation part has a structure with a small upper portion and a large lower portion. The isolation part is formed in the same trench, and thus has a single longitudinal axis, that is, the lower portion and the upper portion of the second isolation part are centrically aligned in a vertical direction.

According to other embodiments, the gate spacer 1020 (including the dummy gate spacer) may be partially or even completely removed due to subsequent processes. In the above embodiments, the dielectric thin layer is formed only on the sidewalls of the upper portion of the trench T. According to other embodiments, a thin dielectric layer may further be formed along the inner walls of the trench after the trench is widened and deepened.

FIGS. 23-32 are schematic views illustrating some steps of a process of manufacturing a semiconductor arrangement in accordance with another embodiment of the present disclosure. Hereinafter, focus will be put on differences between the present embodiment and the above embodiments.

Figure 23:
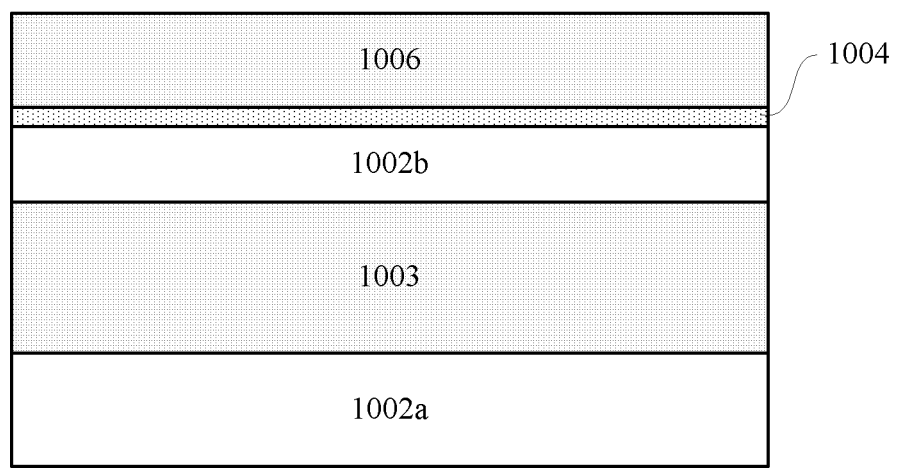
FIGS. 23-32 are schematic views illustrating some steps of a process of manufacturing a semiconductor arrangement in accordance with another embodiment of the present disclosure.

As shown in FIG. 23, a substrate 1002a may be provided. Regarding the substrate 1002a, reference may be made to the above descriptions of the substrate 1002, and details thereof will not be described here again.

A first semiconductor layer 1003 and a second semiconductor layer 1002b may be disposed on the substrate 1002a by, for example, epitaxial growth. Adjacent layers of the substrate 1002a, the first semiconductor layer 1003, and the second semiconductor layer 1002b may have etching selectivity with respect to each other, by, for example, including different semiconductor materials. For example, in a case where the substrate 1002a is a bulk silicon substrate, the first semiconductor layer 1003 may include SiGe (with an atomic percentage of Ge of, for example, about 10-30%), with a thickness of about 10-50 nm, and the second semiconductor layer 1002b may include Si, with a thickness of about 10-100 nm.

Similarly, hard mask layers such as an oxide layer 1004 and a nitride layer 1006 may be formed on the second semiconductor layer 1002b. Reference may be made to the above descriptions of the oxide layer 1004 and the nitride layer 1006, and details thereof will not be described here again.

Then, the operations described above in conjunction with FIGS. 1(a)-10 may be performed, and details thereof will not be described here again. Regarding the spatial positional relationship, the substrate 1002a may correspond to a portion of the substrate 1002 below the well region 1002-1, the first semiconductor layer 1003 may correspond to the well region 1002-1, and the second semiconductor layer 1002b may correspond to a portion of the substrate 1002 on top of the well region 1002-1.

Figure 24:
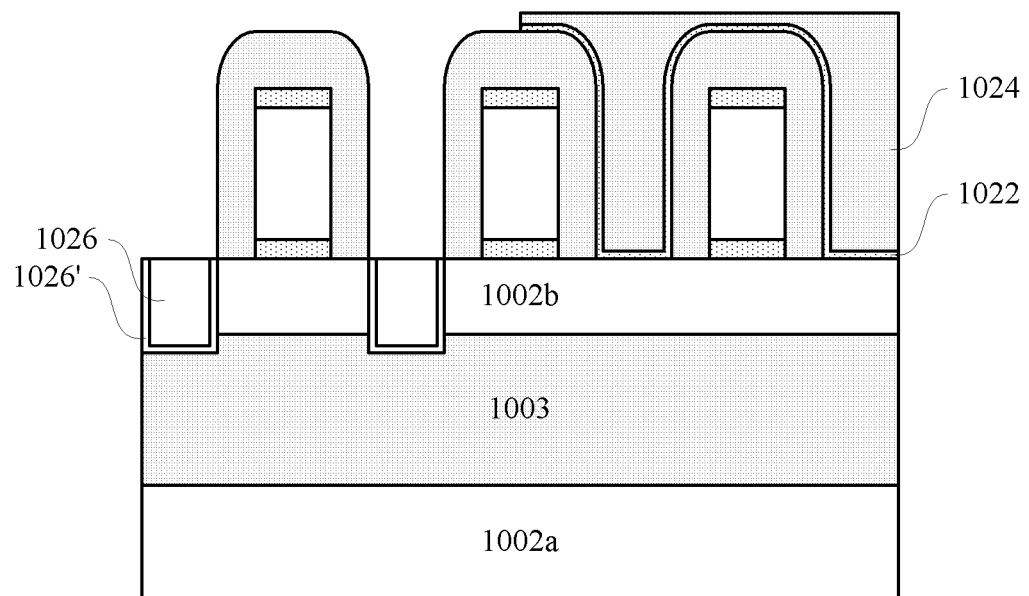

According to another embodiment of the present disclosure, a stop layer may be formed firstly when embedded source/drains are formed. For example, as shown in FIG. 24 (a cross sectional view taken along line AA'), for the P-type device, a stop layer 1026' may be grown and then a semiconductor layer 1026 may be grown. Regarding the semiconductor layer 1026, reference may be made to the above descriptions, and details thereof will not be described here again. The stop layer 1026' may include a semiconductor material having etching selectivity with respect to the first semiconductor layer 1003, such as SiGe (with an atomic percentage of Ge of, for example, about 10%, which is different from that of Ge in the first semiconductor layer 1003 to provide etching selectivity), with a thickness of about 1-3 nm. The stop layer 1026' may likewise be doped in situ to form a portion of the source/drain regions.

For the N-type device, processing may be similarly performed. That is, a stop layer (not shown) may be formed before a semiconductor layer 1032 is formed.

Hereinafter, still a case where the stop layer is not formed will be described by way of example.

Figure 25:
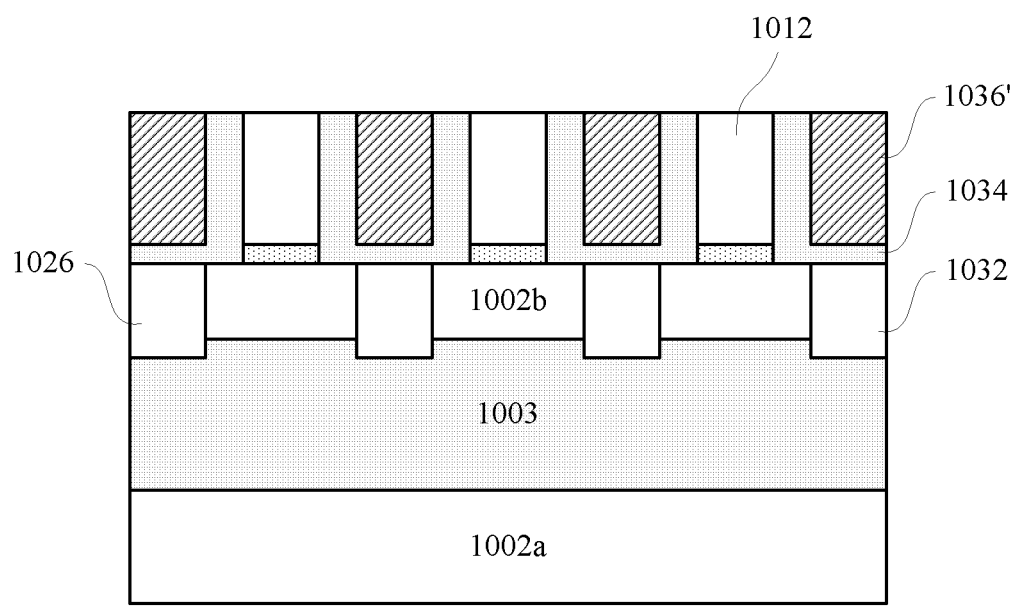

As shown in FIG. 25 (a cross sectional view taken along line AA'), an interlayer dielectric layer 1036' may be formed on the substrate by, for example, deposition. Here, in order to provide etching selectivity in subsequent processes, the interlayer dielectric layer 1036' may include SiC. Reference may be made to the above descriptions in conjunction with FIGS. 11 and 12, and details thereof will not be described here again.

According to an advantageous example, in order to reduce punch-through, an isolation layer extending under a fin may be formed.

Figure 26A:
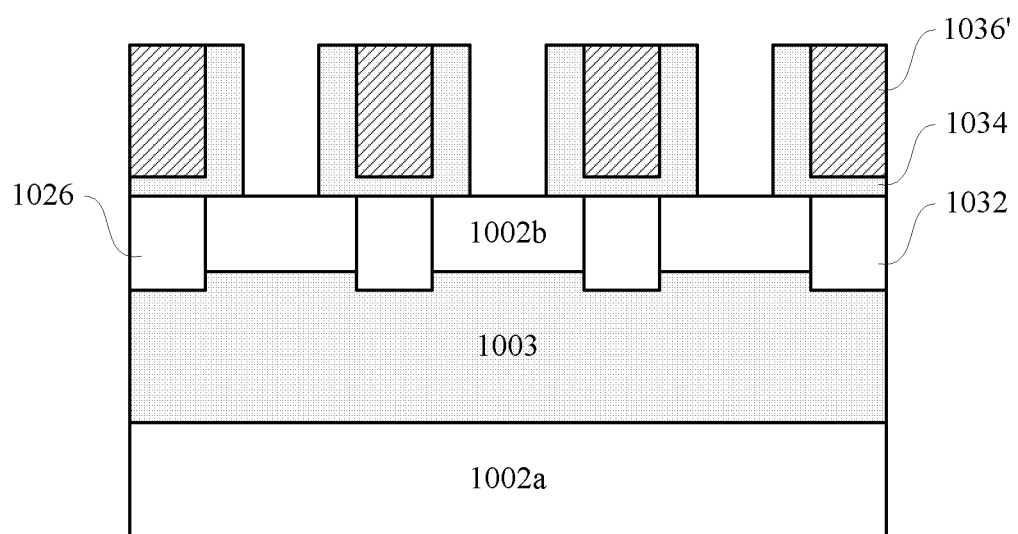
Figure 26B:
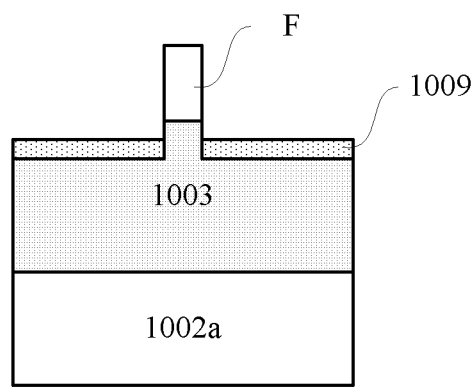

For example, as shown in FIGS. 26(a) and 26(b) (cross sectional views along line AA' and line BB', respectively), the sacrificial gate structures may be removed to expose space inside the respective gate spacers. Due to the removal of the sacrificial gate structures, the underlying STI isolation layer 1009 is exposed. If a top surface of the STI isolation layer 1009 is not lower than a top surface of the first semiconductor layer 1003 and thus shields the first semiconductor layer 1003, the STI isolation layer 1009 may be etched back by, for example, RIE to expose the first semiconductor layer 1003 (in particular, at least a portion of sidewalls thereof), as shown in FIG. 26(b).

Figure 27A:
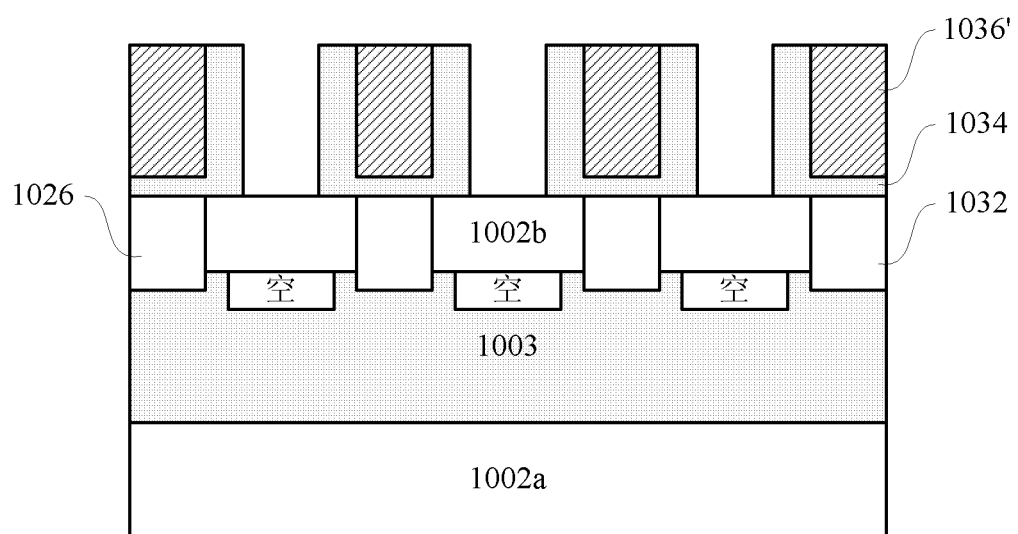
Figure 27B:
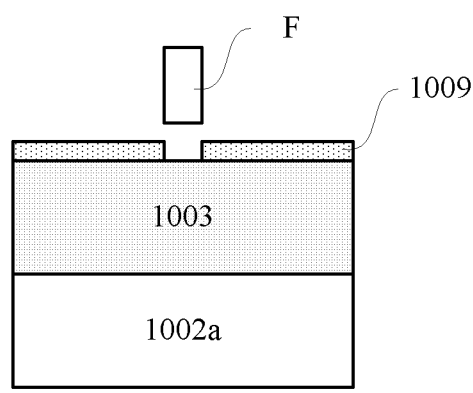

Due to the exposure of the first semiconductor layer 1003, at least a portion of the first semiconductor layer 1003 may be removed to form gaps under the second semiconductor layer 1002b. For example, as shown in FIGS. 27(a) and 27(b) (cross sectional views along line AA' and line BB', respectively), the first semiconductor layer 1003 may be selectively etched. In order to control an amount of the etching, particularly an amount of the etching in a longitudinally extending direction of the fin structure F, Atomic Layer Etching (ALE) may be adopted. Because the first semiconductor layer 1003 is selectively etched through the space inside the gate spacers, the resultant gaps may be self-aligned to the space inside the respective gate spacers, that is, they are centrically aligned in a vertical direction. Further, top surfaces of the gaps correspond to the top surface of the first semiconductor layer 1003 (or a bottom surface of the second semiconductor layer 1002b) and are therefore coplanar with each other. This may reduce process fluctuations.

Figure 28:
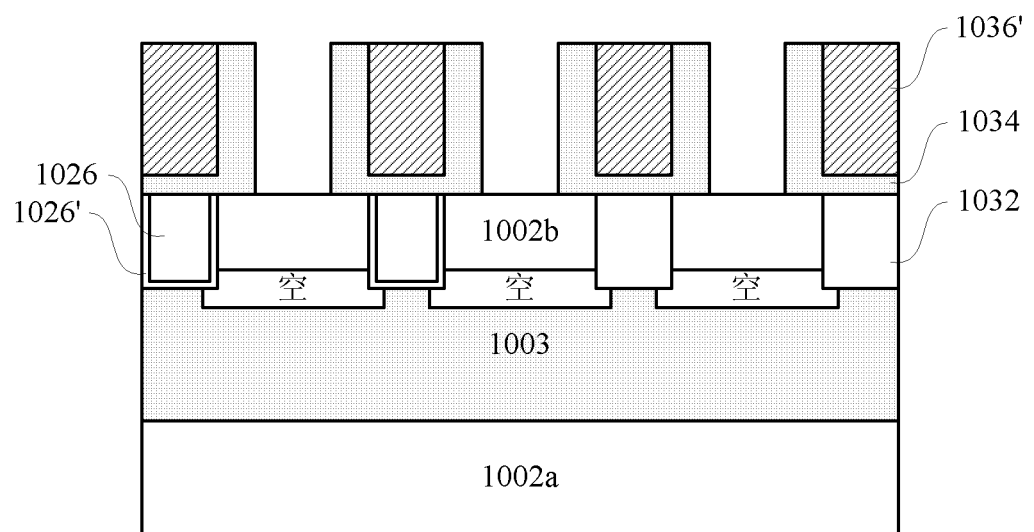

According to another embodiment, when the first semiconductor layer 1003 is selectively etched, the etching may laterally stop at the semiconductor layers 1026, 1032 where the source/drain regions are located (in a case where the stop layer 1026' is formed, at the stop layer 1026'), as shown in FIG. 28 (a cross sectional view taken along line AA').

Figure 29A:
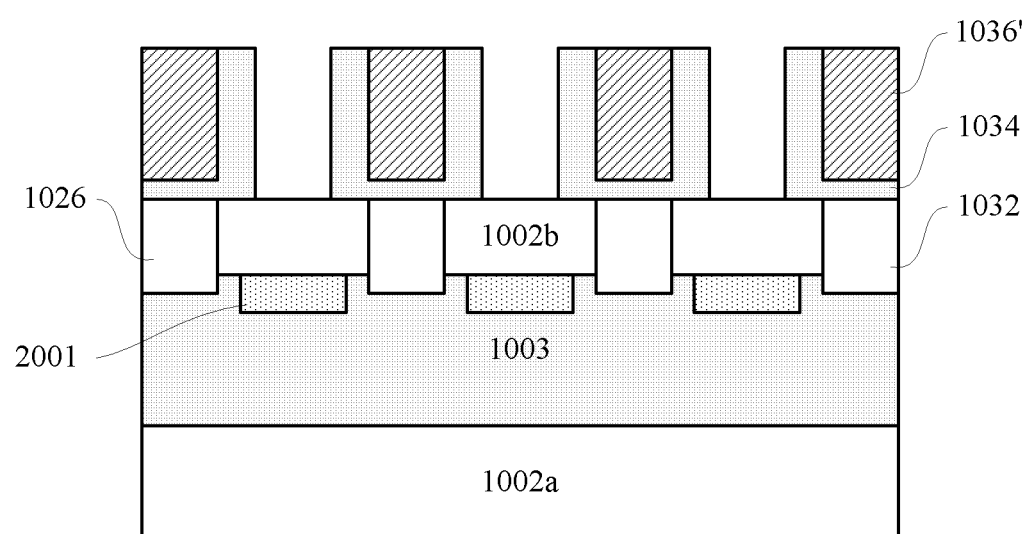
Figure 29B:
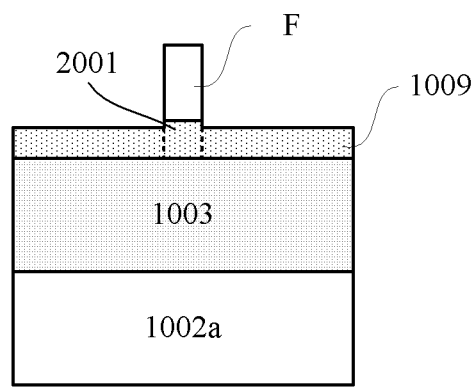

Then, as shown in FIGS. 29(a) and 29(b) (cross sectional views along line AA' and line BB', respectively), the gaps may be filled (by, for example, deposition followed by back-etching) with a dielectric material such as oxide to form isolation layers 2001. As shown in FIG. 29(b), the isolation layers 2001 extend under the second semiconductor layer 1002b and may extend to positions of the source/drain regions on opposite sides thereof as described above. Because the gaps are self-aligned to the space inside the gate spacers, the isolation layers 2001 are self-aligned to the space inside the gate spacers, that is, they are centrically aligned in the vertical direction. Because both the STI isolation layer 1009 and the isolation layer 2001 include oxide, an interface between the STI isolation layer 1009 and the isolation layer 2001 is shown by dashed lines.

In the example, a top surface of the etched-back STI isolation layer 1009 may be lower than the bottom surface of the second semiconductor layer 1002b. However, the present disclosure is not limited thereto. For example, depending on an amount of the back-etching, the top surface of the STI isolation layer 1009 may be (slightly) higher or (slightly) lower than the bottom surface of the second semiconductor layer 1002b.

Here, because the interlayer dielectric layer 1036' includes SiC, it is not removed when the oxide is etched back. Thus, a space is left only inside the gate spacers for subsequent formation of the gate structures.

Then, the processing may be performed according to the operations described above in conjunction with FIGS. 13 to 15. For example, the gate structures may be formed, the gate conductor layer may be recessed downwardly and a dielectric layer 1042 (which may include SiC in the example) may be filled, and the device regions may be shielded while the dummy gate stack region being exposed.

Figure 30:
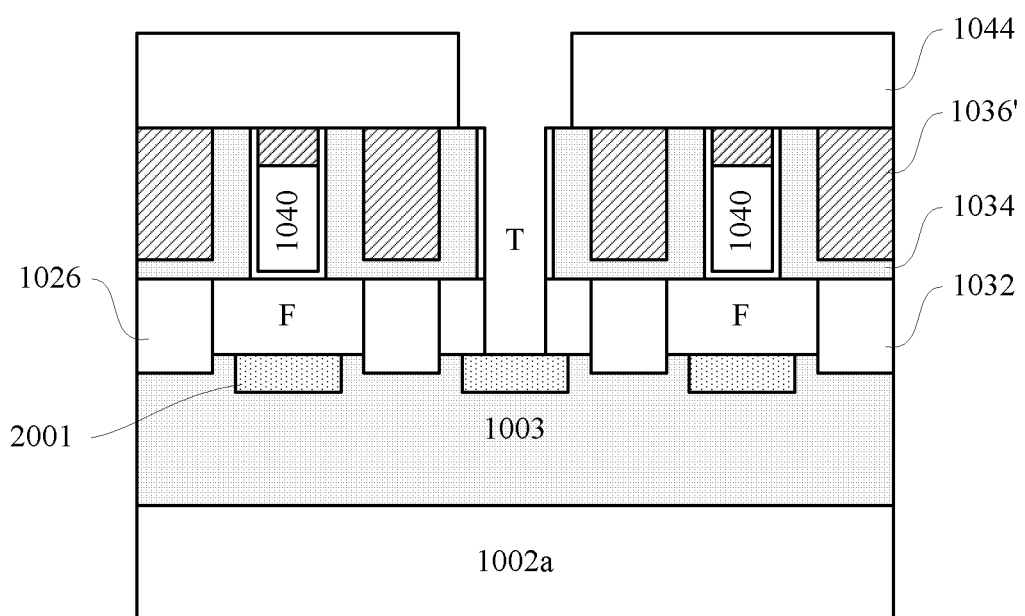

As shown in FIG. 30 (a cross sectional view taken along line AA'), the dielectric layer 1042, the replacement gate conductor layer 1040, the replacement gate dielectric layer 1038, and the fin structure F may be selectively removed in sequence by selective etching such as RIE to form a trench T. The etching may stop at the underlying isolation layers 1009, 2001. As described above, the trench T may be self-aligned to the space defined by the gate spacer 1020.

Figure 31:
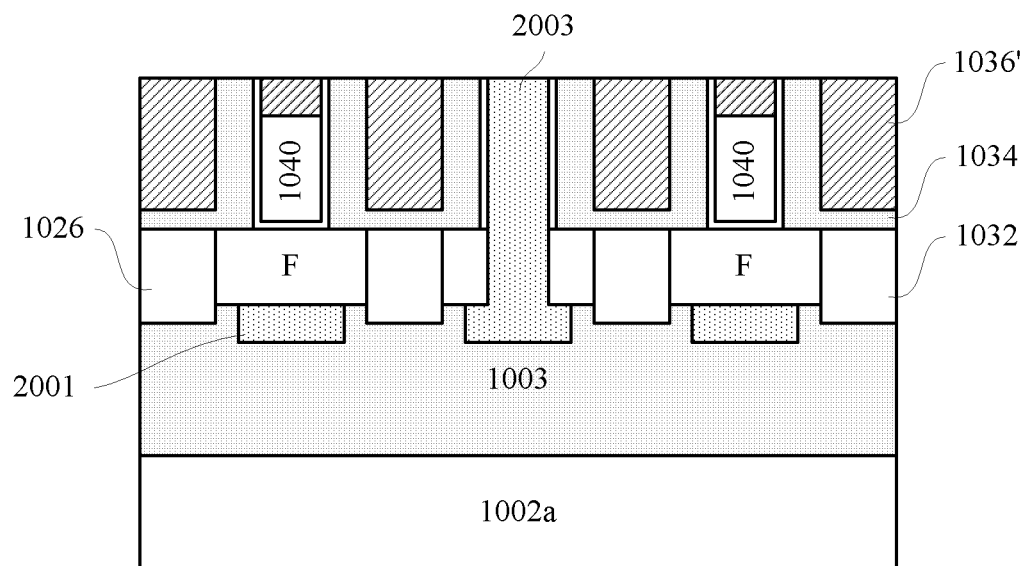

Then, as shown in FIG. 31 (a cross sectional view taken along line AA'), the trench T may be filled (by, for example, deposition followed by planarization) with a dielectric material such as oxide to form an isolation part 2003. Likewise, the isolation part 2003 may be self-aligned to the space defined by the gate spacer 1020.

Figure 32:
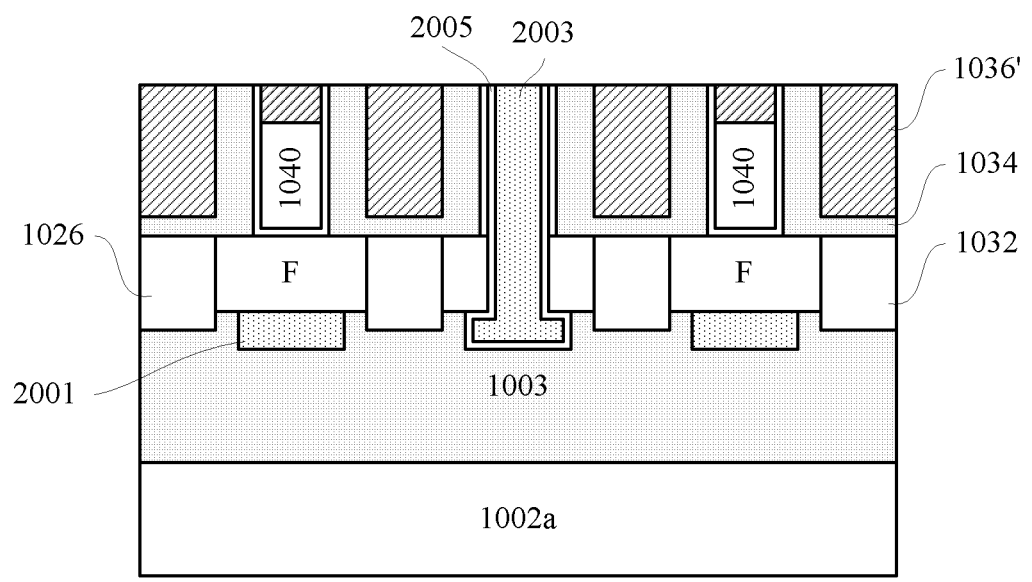

According to another embodiment, as shown in FIG. 32 (a cross sectional view taken along line AA'), before the dielectric is filled, the isolation layers 2001 may firstly be removed, and a dielectric layer 2005 may be formed on inner walls of the trench, which is then filled with the dielectric. The dielectric layer 2005 facilitates improving the electrical insulating properties, such as electrical breakdown, low k or the like, and protecting devices.

As shown in FIGS. 31 and 32, similar to the above embodiments, this semiconductor arrangement may comprise the P-type device and the N-type device. Each of the devices may comprise a respective gate stack (comprising the replacement gate dielectric layer 1038 and the replacement gate conductor layer 1040) and the gate spacer 1020 disposed on the sidewalls of the gate stack. Between the two devices, the dummy gate spacer may be formed. As described above, the isolation parts 2001, 2003 are self-aligned to the space defined by the dummy gate spacer.

The isolation parts 2001 and 2003 (which may be referred to collectively as "a second isolation part") constitute isolation between devices. Similarly, in the cross sections of FIGS. 31 and 32, the lower isolation part 2001 is expanded with respect to the upper isolation part 2003. Due to the expansion, the isolation part 2001 may form a step with respect to the isolation part 2003, and the step may be coplanar with the top surface of the first semiconductor layer 1003 or the bottom surface of the second semiconductor layer 1002b.

Further, this semiconductor arrangement may further comprise the isolation layer 2001 which is formed under the fin structure F of the P-type device region and/or the N-type device region. As described above, the isolation layer 2001 extends under the fin structure F, and thus functions like electrical isolation incorporated under the channel region(s) of the device(s). Therefore, advantages like those of an SOI structure, such as, a reduced leakage current, may be achieved. On the other hand, the isolation layer 2001 may extend not to be under the source/drain regions, and therefore at least a part of the source/drain regions is contiguous with the bulk substrate. In this way, some disadvantages of an SOI structure, such as, the self-heating effect, may be avoided.

According to other embodiments, the isolation layers 2001 may not be formed in the P-type device region and/or the N-type device region. This may be achieved, for example, by masking the corresponding device region(s) in the process of forming the isolation layers 2001.

Although the gate-last process is illustrated in the above embodiments, the present disclosure is not limited thereto. The technology in the present disclosure is also applicable to the gate-first process.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

I claim:

1. A method of manufacturing a semiconductor arrangement, comprising:
    providing a stack structure in which a base substrate, a first semiconductor layer, and a second semiconductor layer are stacked in sequence;
    forming a fin structure on the stack structure, wherein the fin structure has a bottom portion lower than a bottom surface of the second semiconductor layer;
    forming a first isolation part around the fin structure on opposite sides of the fin structure;
    forming, on the first isolation part, a dummy gate structure intersecting the fin structure, and forming, on opposite sides of the dummy gate structure, a first gate structure and a second gate structure intersecting the fin structure respectively;
    forming a first gate spacer, a second gate spacer, and a dummy spacer on sidewalls of the first gate structure, the second gate structure, and the dummy gate structure, respectively;
    removing the dummy gate structure to expose the first semiconductor layer inside the dummy spacer;
    selectively etching the first semiconductor layer;
    forming a portion of the second isolation section by filling a dielectric material into a space due to the selective etching of the first semiconductor layer under the second semiconductor layer inside the dummy spacer;
    selectively etching the fin structure based on the dummy spacer; and
    form another portion of the second isolation part by filling a dielectric material inside the dummy spacer.

2. The method of claim 1, wherein
    the first gate structure, the second gate structure, and the dummy gate structure are sacrificial gate structures,
    the method further comprises removing the first gate structure and the second gate structure in the process of removing the dummy gate structure,
    selectively etching the first semiconductor layer comprises selectively etching the first semiconductor layer which is exposed due to the removing of the dummy gate structure, the first gate structure, and the second structure,
    forming a portion of the second isolation part further comprises: forming a third isolation part by filling the dielectric material into a space due to the selective etching of the first semiconductor layer under the second semiconductor layer inside the first gate spacer; and forming a fourth isolation part by filling the dielectric material into a space due to the selective etching of the first semiconductor layer under the second semiconductor layer inside the second gate spacer, and
    the method comprises, after forming the portion of the second isolation part, the third isolation part, and the fourth isolation part, forming replacement gate structures in the respective spaces inside the dummy spacer and the first and second gate spacers, and removing the replacement gate structure inside the dummy spacer to expose the fin structure for selective etching of the fin structure.

3. The method of claim 1, further comprising:
    forming a further semiconductor layer which is at least partially embedded in the fin structure on opposite sides of the first gate spacer and/or the second gate spacer.

4. The method of claim 3, wherein the selective etching of the first semiconductor layer stops laterally at the further semiconductor layer.

5. The method of claim 4, wherein the further semiconductor layer has a stack structure.

6. The method of claim 1, further comprising forming an insulating spacer on sidewalls of a trench inside the dummy spacer resulting from the selective etching of the fin structure.

7. The method of claim 6, wherein the method further comprises, after selectively etching the fin structure and before forming the insulating spacer, removing the portion of the second isolation part.

8. The method of claim 1, wherein exposing the first semiconductor layer inside the dummy spacer comprises:
    selectively etching the first isolation part to at least partially expose sidewalls of the first semiconductor layer.

9. A method of manufacturing a semiconductor arrangement, comprising:
    forming a fin structure on a substrate;
    forming a first isolation part around the fin structure on opposite sides of the fin structure;
    forming, on the first isolation part, a dummy gate structure intersecting the fin structure, and forming, on opposite sides of the dummy gate structure, a first gate structure and a second gate structure intersecting the fin structure respectively;
    forming a first gate spacer, a second gate spacer, and a dummy spacer on sidewalls of the first gate structure, the second gate structure, and the dummy gate structure, respectively;
    forming a trench downwards inside the dummy spacer;
    isotropically etching a bottom portion of the trench to deepen the trench and expanding a lower portion of the trench; and
    forming an isolation part by filling the trench with a dielectric material.

10. The method of claim 9, wherein forming a trench comprises:

forming a mask layer to shield a region of a first semiconductor device corresponding to the first gate structure and a region of a second semiconductor device corresponding to the second gate structure;

selectively etching the dummy gate structure with respect to the dummy spacer, and further performing selective etching downwards to form an upper portion of the trench; and forming an insulating spacer on inner walls of the upper portion of the trench.

11. The method of claim 9, wherein forming an isolation part comprises:

filling the trench with a dielectric material, wherein the dielectric material extends along sidewalls of the trench at the lower portion of the trench to form a hollow structure.

12. The method of claim 11, wherein forming an isolation part further comprises:

removing the dielectric material filled in the upper portion of the trench; and further filling the trench with the dielectric material to fill up the trench with the dielectric material.

\* \* \* \* \*